United States Patent
Riepen et al.

(10) Patent No.: US 9,753,383 B2
(45) Date of Patent: Sep. 5, 2017

(54) RADIATION SOURCE AND LITHOGRAPHIC APPARATUS

(71) Applicant: ASML Netherlands B.V., Veldhoven (NL)

(72) Inventors: Michel Riepen, Veldhoven (NL); Dzmitry Labetski, Utrecht (NL); Wilbert Jan Mestrom, Roermond (NL); Wim Ronald Kampinga, Enschede (NL); Jan Okke Nieuwenkamp, Enschede (NL); Jacob Brinkert, Schalkhaar (NL); Henricus Jozef Castelijns, Bladel (NL); Nicolaas Ten Kate, Almkerk (NL); Hendrikus Gijsbertus Schimmel, Utrecht (NL); Hans Jansen, Eindhoven (NL); Dennis Jozef Maria Paulussen, Eindhoven (NL); Brian Vernon Virgo, Eindhoven (NL); Reinier Theodorus Martinus Jilisen, Eindhoven (NL); Ramin Badie, Eindhoven (NL); Albert Pieter Rijpma, Veldhoven (NL); Johannes Christiaan Leonardus Franken, Knegsel (NL); Peter Van Putten, Eindhoven (NL); Gerrit Van Der Straaten, Oisterwijk (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 14/409,048

(22) PCT Filed: Jun. 13, 2013

(86) PCT No.: PCT/EP2013/062259
§ 371 (c)(1),
(2) Date: Dec. 18, 2014

(87) PCT Pub. No.: WO2013/189827
PCT Pub. Date: Dec. 27, 2013

(65) Prior Publication Data
US 2015/0338753 A1    Nov. 26, 2015

Related U.S. Application Data

(60) Provisional application No. 61/663,210, filed on Jun. 22, 2012, provisional application No. 61/679,567, (Continued)

(51) Int. Cl.
*G03F 7/20* (2006.01)
*G21K 5/08* (2006.01)
(Continued)

(52) U.S. Cl.
CPC ....... *G03F 7/70983* (2013.01); *F15D 1/0065* (2013.01); *G03F 7/70033* (2013.01); (Continued)

(58) Field of Classification Search
CPC ............. G03F 7/70916; G03F 7/70033; G03F 7/70908; G03F 7/70925; G03F 7/70983; (Continued)

(56) References Cited

U.S. PATENT DOCUMENTS

| | | | |
|---|---|---|---|
| 6,232,613 B1 | 5/2001 | Silfvast et al. | |
| 7,642,533 B2 * | 1/2010 | Partio | B82Y 10/00 250/504 R |

(Continued)

FOREIGN PATENT DOCUMENTS

JP    2005-108834 A    4/2005

OTHER PUBLICATIONS

Alchagirov, B.B., et al., "Temperature Dependence of the Density of Liquid Tin" High Temperature, vol. 38, No. 1, 2000, pp. 44-48.*

(Continued)

*Primary Examiner* — Wyatt Stoffa
(74) *Attorney, Agent, or Firm* — Sterne, Kessler, Goldstein & Fox P.L.L.C.

(57) ABSTRACT

A radiation source comprising a fuel source configured to deliver fuel to a location from which the fuel emits EUV radiation. The radiation source further comprises an immobile fuel debris receiving surface provided with a plurality of grooves. The grooves have orientations which are arranged to direct the flow of liquid fuel under the influence of gravity in one or more desired directions.

14 Claims, 18 Drawing Sheets

Related U.S. Application Data filed on Aug. 3, 2012, provisional application No. 61/702,443, filed on Sep. 18, 2012, provisional application No. 61/713,922, filed on Oct. 15, 2012, provisional application No. 61/722,488, filed on Nov. 5, 2012, provisional application No. 61/739,358, filed on Dec. 19, 2012, provisional application No. 61/806,644, filed on Mar. 29, 2013.

(51) Int. Cl.
*F15D 1/00* (2006.01)
*G21K 1/06* (2006.01)
*H05G 2/00* (2006.01)

(52) U.S. Cl.
CPC ............ *G03F 7/70916* (2013.01); *G21K 1/06* (2013.01); *G21K 5/08* (2013.01); *H05G 2/005* (2013.01); *H05G 2/008* (2013.01); *Y10T 137/206* (2015.04)

(58) Field of Classification Search
CPC ........ H05G 2/003; H05G 2/005; H05G 2/008; G21K 1/06; G21K 5/08
See application file for complete search history.

(56) References Cited

U.S. PATENT DOCUMENTS

| | | | | |
|---|---|---|---|---|
| 8,067,756 | B2* | 11/2011 | Ueno | H05G 2/003 250/364 |
| 2004/0160155 | A1* | 8/2004 | Partlo | B82Y 10/00 313/231.31 |
| 2005/0072942 | A1 | 4/2005 | Barthod et al. | |
| 2005/0111080 | A1 | 5/2005 | Bakker et al. | |
| 2005/0253092 | A1* | 11/2005 | Zukavishvili | B82Y 10/00 250/492.2 |
| 2006/0024216 | A1 | 2/2006 | Hergenhan et al. | |
| 2008/0029717 | A1 | 2/2008 | Shirai | |
| 2008/0283779 | A1* | 11/2008 | Tran | G03F 7/70916 250/504 R |
| 2009/0001288 | A1* | 1/2009 | Buis | G03F 7/70916 250/492.2 |
| 2009/0014027 | A1* | 1/2009 | Schriever | B08B 5/00 134/1.1 |
| 2009/0073401 | A1 | 3/2009 | Buis et al. | |
| 2009/0153975 | A1 | 6/2009 | O'Reilly et al. | |
| 2009/0230326 | A1* | 9/2009 | Vaschenko | H05G 2/003 250/492.2 |
| 2010/0127186 | A1 | 5/2010 | Bykanov et al. | |
| 2010/0213395 | A1* | 8/2010 | Ueno | H05G 2/008 250/504 R |
| 2010/0231130 | A1* | 9/2010 | Labetski | G03F 7/70033 315/111.41 |
| 2010/0243922 | A1* | 9/2010 | Asayama | H05G 2/003 250/504 R |
| 2010/0258748 | A1* | 10/2010 | Vaschenko | H05G 2/003 250/504 R |
| 2010/0258749 | A1* | 10/2010 | Partlo | H05G 2/003 250/504 R |
| 2011/0007292 | A1* | 1/2011 | Van Herpen | 355/67 |
| 2011/0048452 | A1* | 3/2011 | Zink | B08B 7/00 134/1 |
| 2011/0116604 | A1* | 5/2011 | Faubel | H05G 2/003 378/143 |
| 2011/0164236 | A1 | 7/2011 | Yakunin et al. | |
| 2011/0240890 | A1* | 10/2011 | Govindaraju | H05G 2/001 250/504 R |
| 2011/0242515 | A1* | 10/2011 | Ceglio | G02B 5/0891 355/67 |
| 2011/0253913 | A1 | 10/2011 | Nagai et al. | |
| 2012/0097869 | A1* | 4/2012 | Ueno | H05G 2/008 250/504 R |
| 2012/0119116 | A1* | 5/2012 | Kakizaki | G03F 7/70033 250/504 R |
| 2012/0176036 | A1* | 7/2012 | Asayama | H05G 2/003 315/111.41 |
| 2012/0228527 | A1* | 9/2012 | Abe | G03F 7/70033 250/504 R |
| 2014/0043595 | A1* | 2/2014 | Ceglio | G02B 5/0891 355/71 |
| 2014/0048099 | A1* | 2/2014 | Partlo | H05G 2/003 134/1.1 |
| 2014/0138560 | A1* | 5/2014 | Umeda | H05G 2/005 250/504 R |
| 2015/0138519 | A1* | 5/2015 | Luijten | G03F 7/70916 355/30 |
| 2016/0012929 | A1* | 1/2016 | Kuznetsov | G21K 1/062 250/505.1 |

OTHER PUBLICATIONS

Kitron-Belinkov, M., et al., "Groovy Drops: Effect of Groove Curvature on Spontaneous Capillary Flow," Langmuir, vol. 23, No. 16, Jul. 2007.

Romero, L.A., et al., "Flow in an open channel capillary," Journal of Fluid Mechanics, vol. 322, Sep. 1996; pp. 109-129.

Wilinski, S.A., et al., "Gravity Force in Capillary Flow Through Open Channels," International Journal of Thermophysics, vol. 31, No. 11-12, Dec. 2010; pp. 2402-2415.

International Search Report directed to related International Patent Application No. PCT/EP2013/062259, mailed Apr. 2, 2014; 9 pages.

International Preliminary Report on Patentability and Written Opinion of the International Searching Authority directed to related International Patent Application No. PCT/EP2013/062259, issued Dec. 23, 2014; 15 pages.

* cited by examiner

RADIATION SOURCE AND LITHOGRAPHIC APPARATUS

CROSS-REFERENCE TO RELATED APPLICATIONS

This application claims the benefit of U.S. provisional application 61/663,210, which was filed on 22 Jun. 2012, U.S. provisional application 61/679,567, which was filed on 3 Aug. 2012, U.S. provisional application 61/702,443 which was filed on 18 Sep. 2012, U.S. provisional application 61/713,922, which was filed on 15 Oct. 2012, U.S. provisional application 61/722,488, which was filed on 5 Nov. 2012, U.S. provisional application 61/739,358, which was filed on 19 Dec. 2012, U.S. provisional application 61/806,644, which was filed on 29 Mar. 2013 and which are incorporated herein in their entirety by reference.

FIELD

The present invention relates to a radiation source and to a lithographic apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., comprising part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned.

Lithography is widely recognized as one of the key steps in the manufacture of ICs and other devices and/or structures. However, as the dimensions of features made using lithography become smaller, lithography is becoming a more critical factor for enabling miniature IC or other devices and/or structures to be manufactured.

A theoretical estimate of the limits of pattern printing can be given by the Rayleigh criterion for resolution as shown in equation (1):

$$CD = k_1 * \frac{\lambda}{NA} \quad (1)$$

where $\lambda$ is the wavelength of the radiation used, NA is the numerical aperture of the projection system used to print the pattern, k1 is a process dependent adjustment factor, also called the Rayleigh constant, and CD is the feature size (or critical dimension) of the printed feature. It follows from equation (1) that reduction of the minimum printable size of features can be obtained in three ways: by shortening the exposure wavelength $\lambda$, by increasing the numerical aperture NA or by decreasing the value of k1.

In order to shorten the exposure wavelength and, thus, reduce the minimum printable size, it has been proposed to use an extreme ultraviolet (EUV) radiation source. EUV radiation is electromagnetic radiation having a wavelength within the range of 5-20 nm, for example within the range of 13-14 nm. It has further been proposed that EUV radiation with a wavelength of less than 10 nm could be used, for example within the range of 5-10 nm such as 6.7 nm or 6.8 nm. Such radiation is termed extreme ultraviolet radiation or soft x-ray radiation. Possible sources include, for example, laser-produced plasma sources, discharge plasma sources, or sources based on synchrotron radiation provided by an electron storage ring.

EUV radiation may be produced using a plasma. A radiation system for producing EUV radiation may include a laser for evaporating or exciting a fuel to provide the plasma, and a radiation source for containing the plasma. The plasma may be created, for example, by directing a laser beam at a fuel, such as particles of a suitable material (e.g., tin), or a stream of a suitable gas or vapor, such as Xe gas or Li vapor. The resulting plasma emits output radiation, e.g., EUV radiation, which is collected using a radiation collector. The radiation collector may be a mirrored normal incidence radiation collector, which receives the radiation and focuses the radiation into a beam. The radiation source may include an enclosing structure or chamber arranged to provide a vacuum environment to support the plasma. Such a radiation system is typically termed a laser produced plasma (LPP) source. In an alternative radiation system, the plasma is generated by applying an electrical discharge across a gap at which fuel such as tin is located. Such a radiation system is typically termed a discharge produced plasma (DPP) source.

Vaporization of the fuel which generates the plasma may be incomplete, and droplets of un-vaporized fuel may therefore be incident upon surfaces of the radiation source. Accumulation of fuel on optical surfaces of the radiation source may be undesirable because the fuel will modify the reflectivity of the optical surfaces.

SUMMARY

It is desirable to reduce the accumulation of fuel on one or more optical surfaces of a radiation source in a manner which is not know from the prior art.

According to first aspect of the invention, there is provided a radiation source comprising a fuel source configured to deliver fuel to a location from which the fuel emits EUV radiation, wherein the radiation source further comprises an immobile fuel debris receiving surface provided with a plurality of grooves, the grooves having orientations which are arranged to direct the flow of liquid fuel under the influence of gravity in one or more desired directions.

The fuel debris receiving surface may be provided with a plurality of vanes, the plurality of grooves being provided in the vanes.

At least some of the grooves may have a cross-sectional size and/or shape which gives rise to capillary action.

At least some of the grooves may have a cross-sectional size and/or shape which gives rise to wicking action which draws liquid fuel into the grooves.

One or more of the grooves may include a corner which extends longitudinally along the groove.

One or more of the grooves may be v-shaped in cross-section.

The v-shaped groove may have an opening angle which is between around 30° and 50°.

The grooves may comprise a set of grooves which extend substantially parallel to one another.

At least some of the grooves may have a depth of 0.1 mm or more.

At least some of the grooves may have a depth of 2 mm or less.

At least some of the grooves may have a width of 0.1 mm or more.

At least some of the grooves may have a width of 10 mm or less.

Adjacent grooves may be separated by a distance which is equal to or less than twice the capillary length of the liquid fuel.

The vanes may be distributed around a housing of the radiation source.

The vanes may be reflective structures located in the vicinity of an intermediate focus of the radiation source.

The vanes may be located in a fuel catcher of the radiation source.

One or more of the vanes may be substantially helical.

The fuel may be tin, xenon or lithium.

The vanes may be heated to a temperature at which is above the melting temperature of the fuel. The vanes may be heated to a temperature which is below the evaporation temperature of the fuel.

According to a second aspect of the invention there is provided an apparatus comprising the radiation source of the first aspect of the invention, such as a lithographic apparatus, a substrate (e.g. wafer, mask) inspection apparatus, a contamination cleaning apparatus, a substrate processing apparatus or a calibration apparatus.

Optionally, a lithographic apparatus may further comprise one or more of an illumination system configured to condition EUV radiation received from the radiation source, a support constructed to support a patterning device, the patterning device being capable of imparting the EUV radiation with a pattern in its cross-section to form a patterned radiation beam, a substrate table constructed to hold a substrate, and a projection system configured to project the patterned radiation beam onto a target portion of the substrate.

A substrate inspection apparatus may comprise one or more of the following elements: an extreme ultraviolet light source; a support for receiving a substrate for inspection; an extreme ultraviolet imaging sensor; illumination optics located between the extreme ultraviolet light source and the support for the substrate; objective optics located between the support for the substrate and the imaging sensor; and a spectral purity filter disposed on or located proximate to the imaging sensor having one or more selected spectral characteristics.

The contamination cleaning apparatus may further comprise a gas flow, a reactive gas, an electrical field, a vibration inducing actuator or other means to clean undesired fuel debris from a contaminated surface.

According to a third aspect of the invention there is provided a method of generating EUV radiation using a radiation source, the method comprising delivering fuel to a location at which a plasma which emits EUV radiation is generated using the fuel, wherein the method further comprises receiving liquid fuel on an immobile surface of the radiation source, and using grooves provided in the immobile surface to direct the flow of liquid fuel under the influence of gravity in one or more desired directions.

According to a fourth aspect of the invention there is provided a radiation source comprising a fuel source configured to deliver fuel to a location from which the fuel emits EUV radiation, wherein the radiation source further comprises a fuel debris receiving surface, the fuel debris receiving surface being connected to a liquid inlet which is configured to deliver liquid alloy or metal onto the fuel debris receiving surface. A plurality of grooves with characteristics as described above for the first aspect of the invention, the grooves having orientations which are arranged to direct the flow of liquid fuel under the influence of gravity in one or more desired directions, may also be provided in this aspect of the invention.

According to a fifth aspect of the invention there is provided a radiation source comprising a fuel source configured to deliver fuel to a location from which the fuel emits EUV radiation, wherein the radiation source further comprises a fuel debris receiving surface and a liquid inlet configured to deliver a flow of liquid alloy or metal onto the fuel debris receiving surface. A plurality of grooves with characteristics as described above for the first aspect of the invention, the grooves having orientations which are arranged to direct the flow of liquid fuel under the influence of gravity in one or more desired directions, may also be provided in this aspect of the invention.

The liquid inlet may be connected to the fuel debris receiving surface.

The liquid inlet may be configured to provide a coating of liquid alloy or metal on the fuel debris receiving surface.

The fuel debris receiving surface may comprise a plurality of vanes.

Spaces between the vanes may be grooves which direct the flow of liquid alloy or metal under the influence of gravity in one or more desired directions.

The liquid inlet may comprise openings located in the grooves.

The liquid inlet may be configured to deliver liquid alloy or metal at a rate that fills an area at the base of the vanes to a desired fill level.

The vanes may be shaped to generate capillary pressure which draws liquid alloy or metal away from tips of the vanes.

The liquid inlet may comprise a plurality of openings connected to a conduit.

The liquid alloy or metal may be liquid fuel.

The radiation source may further comprise a heater configured to heat the fuel debris receiving surface to a temperature which is above the melting temperature of the fuel.

The liquid inlet may comprise a porous metal through which the metal or alloy is delivered.

The liquid inlet may be configured to deliver a metal or alloy which is liquid at room temperature onto the fuel debris receiving surface.

The metal or alloy may be Galinstan. Alternatively, the metal or allow may be tin or another tin alloy or a further liquid fuel suitable to produce EUV radiation.

The radiation source may comprise a cooling apparatus configured to cool a housing of the radiation source.

The cooling apparatus may be configured to cool the housing of the radiation source to around room temperature.

According to a sixth aspect of the invention there is provided a radiation source comprising a fuel source configured to deliver liquid alloy or metal to a location from which the fuel emits EUV radiation, wherein the radiation source further comprises a vane and an inlet configured to deliver liquid alloy or metal to the vane and thereby maintain a coating of liquid alloy or metal on the vane. A plurality of grooves with characteristics as described above for the first aspect of the invention, the grooves having orientations which are arranged to direct the flow of liquid fuel under the influence of gravity in one or more desired directions, may also be provided in this aspect of the invention.

According to a seventh aspect of the invention there is provided a method of controlling contamination in a radiation source which uses fuel to generate EUV radiation, the method comprising delivering liquid alloy or metal via an inlet onto a fuel debris receiving surface such that a coating of liquid alloy or metal is maintained on the fuel debris receiving surface.

In the method of the sixth or seventh aspect of the invention, the alloy or metal may be delivered continuously via the inlet.

In the method of the sixth or seventh aspect of the invention, the alloy or metal may be delivered intermittently via the inlet.

In the method of the sixth or seventh aspect of the invention, the inlet may comprise a porous metal through which the metal or alloy is delivered.

In the method of the sixth or seventh aspect of the invention, the metal or alloy may be liquid at room temperature.

In the method of the sixth or seventh aspect of the invention, the metal or alloy may be Galinstan.

In the method of the sixth or seventh aspect of the invention, the method may further comprise cooling a housing of the radiation source to room temperature.

According to an eighth aspect of the invention, there is provided a liquid fuel debris guiding apparatus comprising a surface, two electrodes separated from the surface by an insulating layer. A gap is provided between the two electrodes that defines a path on the surface, and a voltage source configured to apply a voltage to one of the electrodes, thereby establishing a potential difference across the gap between the electrodes. The potential difference acts to guide liquid fuel droplets along the path defined by the gap.

The apparatus may further comprise one or more additional electrodes connected to one or more voltage sources, gaps being provided between the electrodes to define paths on the surface.

According to a ninth aspect of the invention there is provided a method of directing a flow of liquid fuel debris. The method comprises applying a voltage to one of two electrodes that are separated from the surface by an insulating layer. A gap is provided between the two electrodes to defines a path on the surface. The voltage establishes a potential difference across the gap between the electrodes, which acts to guide liquid fuel droplets along the path defined by the gap.

According to a tenth aspect of the invention there is provided fuel collector for an EUV radiation source, the fuel collector comprising a receptacle and a reservoir, the reservoir being located above the receptacle, wherein the reservoir is provided with a hole through which liquid fuel may drain from the reservoir into the receptacle, and wherein a raised lip extends around the hole, the raised lip preventing liquid fuel from passing into the hole until a level of the liquid fuel exceeds the height of the raised lip. Such fuel collector may be used together with any radiation source according to the aspects of the invention described herein, to further enhance the debris mitigation.

The raised lip may be formed from a non-wetting material.

The raised lip may be formed from molybdenum.

The raised lip may have a rounded upper surface.

The height of raised lip may be equal to or greater than a capillary length of the liquid fuel.

The fuel collector may further comprise a lip which projects downwardly from the hole.

The downwardly projecting lip may have a sharp inner corner.

According to an eleventh aspect of the invention there is provided a radiation source configured to deliver fuel to a location from which the fuel emits EUV radiation, wherein the radiation source comprises a fuel debris receiving surface and a fuel collector, the fuel collector comprising a receptacle and a reservoir, the reservoir being located above the receptacle, wherein the reservoir is provided with a hole through which liquid fuel may drain from the reservoir into the receptacle, and wherein a raised lip extends around the hole, the raised lip preventing liquid fuel from passing into the hole until a level of the liquid fuel exceeds the height of the raised lip.

According to a twelfth aspect of the invention there is provided a radiation source housing apparatus comprising a rotatably mounted housing, an actuator arranged to drive the housing to rotate, a heater located adjacent to a first portion of the housing, and a cooler located adjacent to a second different portion of the housing. A plurality of grooves with characteristics as described above for the first aspect of the invention, the grooves having orientations which are arranged to direct the flow of liquid fuel under the influence of gravity in one or more desired directions, may also be provided in this aspect of the invention.

Optionally, the first portion of the housing does not have a downwardly facing inner surface.

Optionally, the first portion of the housing does not have an inner surface from within which liquid fuel can drip.

The first portion of the housing may be a lowermost side of the rotatably mounted housing.

The heater may be arranged to heat the first portion of the rotatably mounted housing to a temperature which is above the melting temperature of tin, and the cooler may be arranged to cool the second portion of the rotatably mounted housing to a temperature which is below the melting temperature of tin.

The cooler may extend around at least two thirds of the circumference of the rotatably mounted housing.

The heater may extend around less than one third of the circumference of the rotatably mounted housing.

Optionally, the heater and the cooler do not overlap around the circumference of the rotatably mounted housing.

Optionally, the heater does not extend so far around the housing circumference that the tin will remain in liquid form after the housing has rotated to a point at which the tin is on a downwardly facing surface.

The inner surface of the housing may be provided with grooves.

According to a thirteenth aspect of the invention there is provided a radiation source comprising a fuel source configured to deliver fuel to a location from which the fuel emits EUV radiation, and further comprising a radiation source housing apparatus comprising a rotatably mounted housing, an actuator arranged to drive the housing to rotate, a heater located adjacent to a first portion of the housing, and a cooler located adjacent to a second different portion of the housing.

The heater may be arranged to heat the first portion of the rotatably mounted housing to a temperature which is above the melting temperature of the fuel, and the cooler may be arranged to cool the second portion of the rotatably mounted housing to a temperature which is below the melting temperature of the fuel.

The heater may be arranged to heat the first portion of the rotatably mounted housing to a temperature at which fuel on the housing will be in a liquid state, and the cooler may be arranged to cool the second portion of the rotatably mounted housing to a temperature at which fuel on the housing will be in a solid state.

According to a fourteenth aspect of the invention there is provided a method of generating EUV radiation comprising delivering fuel to a location from which the fuel emits EUV radiation, the method further comprising driving a radiation source housing to rotate, heating a portion of the housing to a temperature which is above the melting temperature of the fuel, and cooling a portion of the housing to a temperature which is below the melting temperature of the fuel.

According to a fifteenth aspect of the invention there is provided a fuel collector for an EUV radiation source, the fuel collector comprising: a receptacle, said receptacle being provided with an entrance and a storage portion; an object, which is disposed within the receptacle such that fuel passing through the entrance is incident upon a surface of the object; and a fuel transferring mechanism configured to transfer fuel collected upon the surface to the storage portion. Such fuel collector may be used together with any radiation source according to the aspects of the invention described herein, to further enhance the debris mitigation.

Such an arrangement allows quantities of fuel to be deposited in the storage portion periodically. Advantageously, this can prevent the formation of a single stalagmite in the receptacle and lead to an improvement in the filling rate of receptacle.

The temperature of the object may be below the melting point of the fuel. The temperature of the object may be such that liquid fuel incident upon the object is allowed to solidify before being transferred to the storage portion.

The fuel transferring mechanism may be arranged to transfer fuel collected upon the surface to the storage portion periodically. Fuel may be transferred to the storage portion after a predetermined period of time or, alternatively, when a sufficient quantity of fuel has been incident upon the object.

The object may be formed from a low wetting material. In particular, the object may be formed from a material which is low wetting with respect to a fuel it is desired to collect. The fuel collector may be particularly suitable for the collection of tin and the object may be formed from molybdenum.

The object may be operable to move between a first position and a second position. Movement of the object between the first and second positions may provide the fuel transferring mechanism. For example, when the object is disposed in the second position, any fuel deposited thereon may fall under gravity into the storage portion. The object may be arranged so that as fuel is incident upon the surface, the object moves from the first position towards the second position.

The object may be resiliently biased towards the first position. The object may comprise a leaf spring and may provide its own resilient bias.

The object may comprise a cantilever structure.

The object may comprise a wheel, wherein rotation of the wheel provides the fuel transferring mechanism.

The object may comprise a shelf, and a member that is operable to sweep across the shelf may provide the fuel transferring mechanism.

The fuel collector may further comprise first and second valves arranged to form an air lock.

According to a sixteenth aspect of the invention there is provided a fuel collector for an EUV radiation source, the fuel collector comprising: a receptacle, said receptacle being provided with a surface arranged such that fuel passing through an entrance of the receptacle is incident thereupon, wherein the surface is formed from a material which is low wetting with respect to a fuel it is desired to collect, the temperature of the surface is below the melting point of the fuel and the surface is inclined with respect to horizontal such that the surface forms a slide. Such fuel collector may be used together with any radiation source according to the aspects of the invention described herein, to further enhance the debris mitigation.

Such an arrangement allows quantities of fuel to be deposited in a storage portion of the receptacle periodically. As liquid fuel is incident upon the surface it will solidify and will only weakly adhere to the surface. As a sufficient quantity of solid fuel builds up it will slide off the surface under gravity. Advantageously, this can prevent fuel from adhering to the receptacle which allows the receptacle to be more easily emptied.

The fuel collector may comprise one or more valves, which may be vacuum valves.

A first valve may be disposed towards and entrance end of the receptacle. During normal operation of the EUV source the first valve may be open, allowing fuel to enter the receptacle. The first valve may be closed periodically to isolate the receptacle from the EUV source so as to allow fuel to be removed therefrom.

The fuel collector may comprise an exit. This may allow fuel to be removed from the receptacle. The exit may be disposed at a lower portion of the receptacle.

A second valve may be located at the exit of the receptacle. During normal operation of the EUV source the second valve may be closed so that the receptacle may be maintained at substantially the same pressure as the EUV source. The second valve may be opened periodically so as to allow fuel to be removed from the receptacle The first and second valves may form an air lock.

Different features of different aspects of the invention may be combined together where appropriate.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present invention and, together with the description, further serve to explain the principles of the invention and to enable a person skilled in the relevant art(s) to make and use the invention.

FIG. 1 schematically depicts a lithographic apparatus according to an embodiment of the invention;

FIG. 2 is a more detailed schematic view of the lithographic apparatus;

FIG. 3 schematically depicts a radiation source according to an embodiment of the invention viewed from above;

FIG. 4 schematically depicts the radiation source of FIG. 3 viewed from one side;

FIG. 5 schematically depicts a groove which may be formed in a surface according to an embodiment of the invention;

FIG. 6 is a graph which represents the effect of changing an angle subtended by the groove;

FIG. 7 schematically depicts a tilted groove according to an embodiment of the invention;

Figure 3:
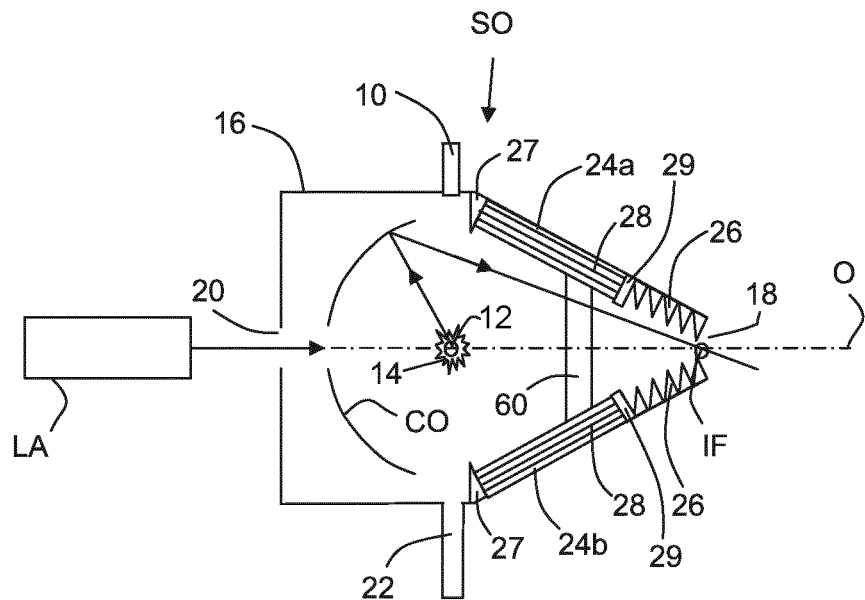
Figure 4:
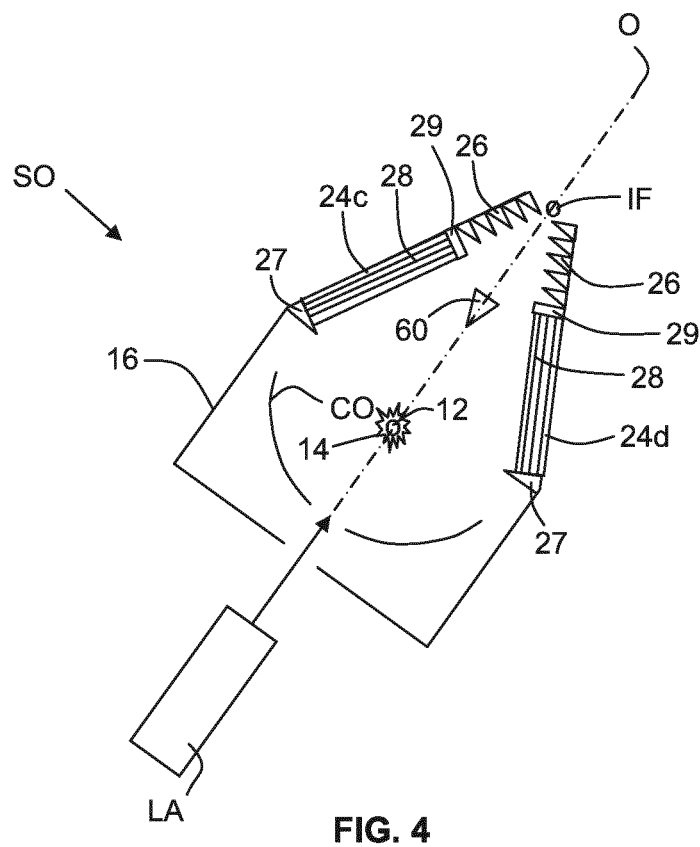
Figure 10:
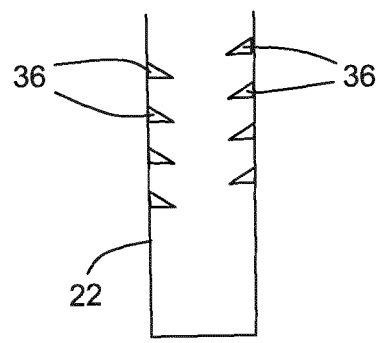
Figure 11:
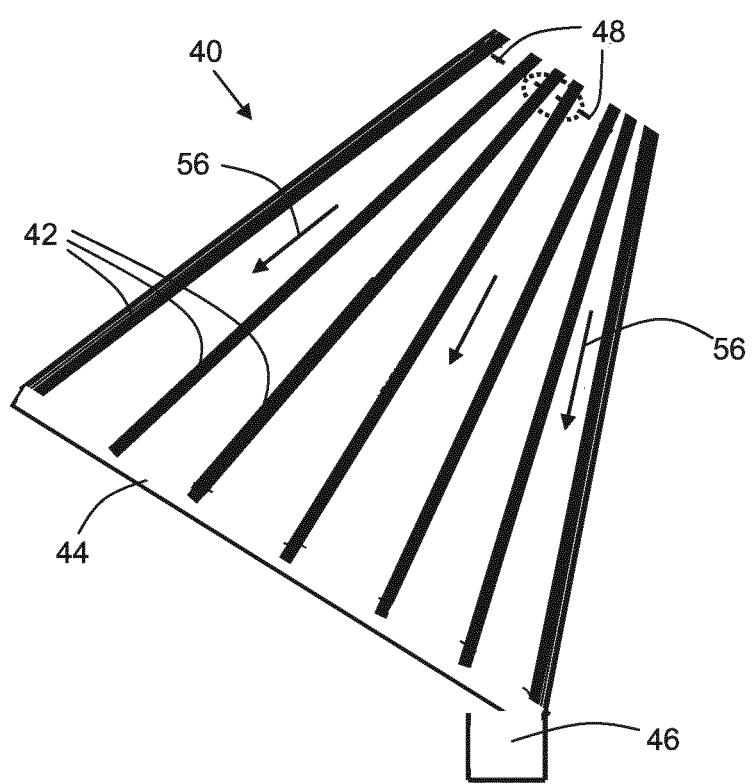
Figure 12:
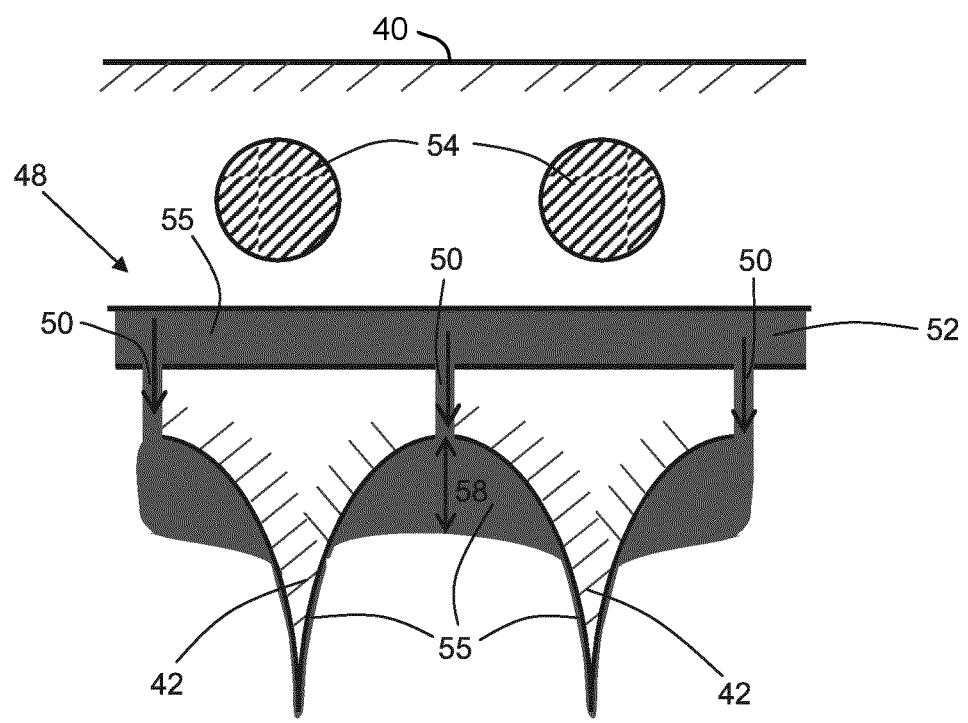
Figure 13:
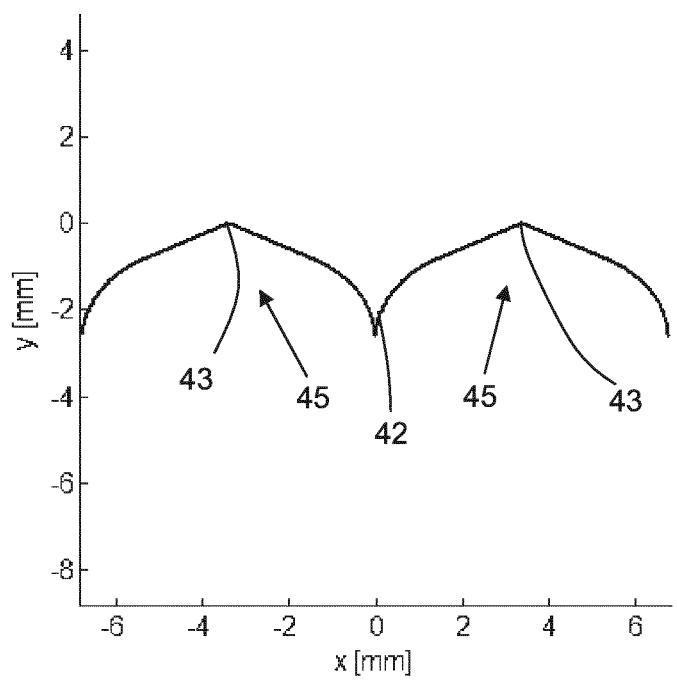
Figure 14:
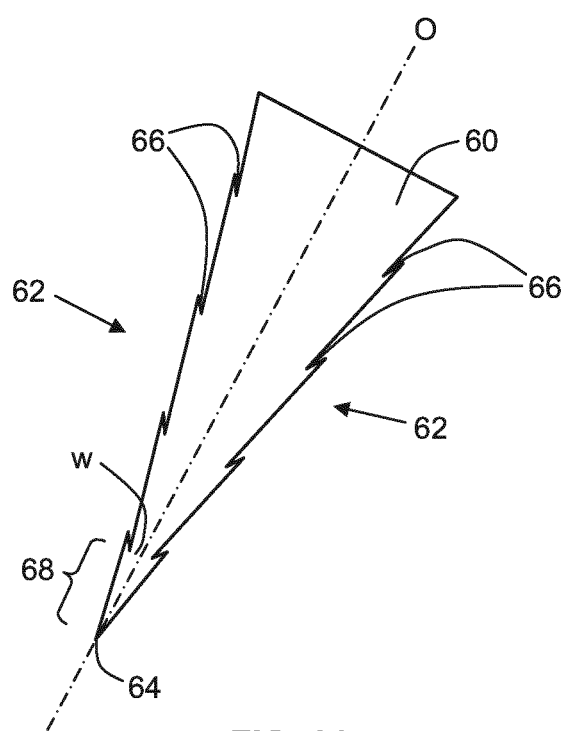
Figure 15:
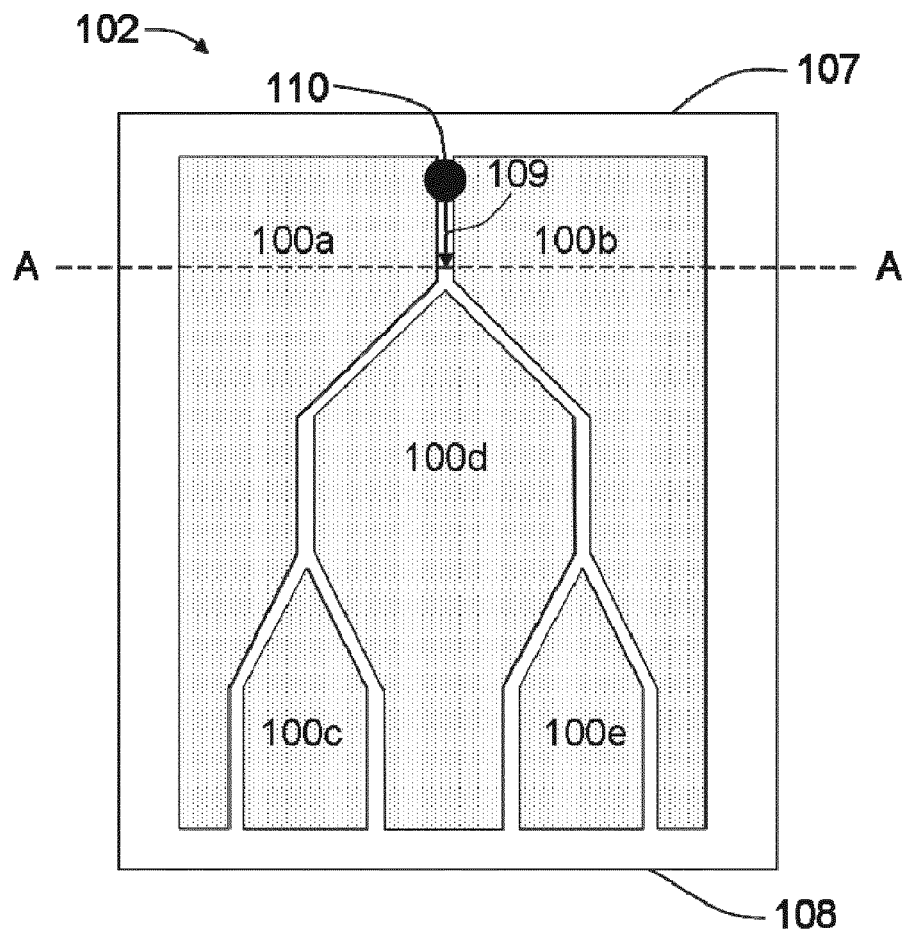
Figure 16:
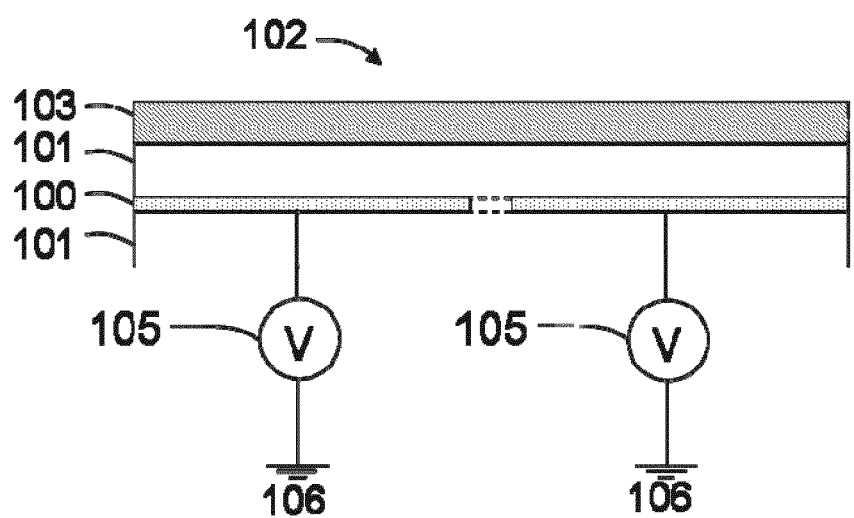
Figure 17:
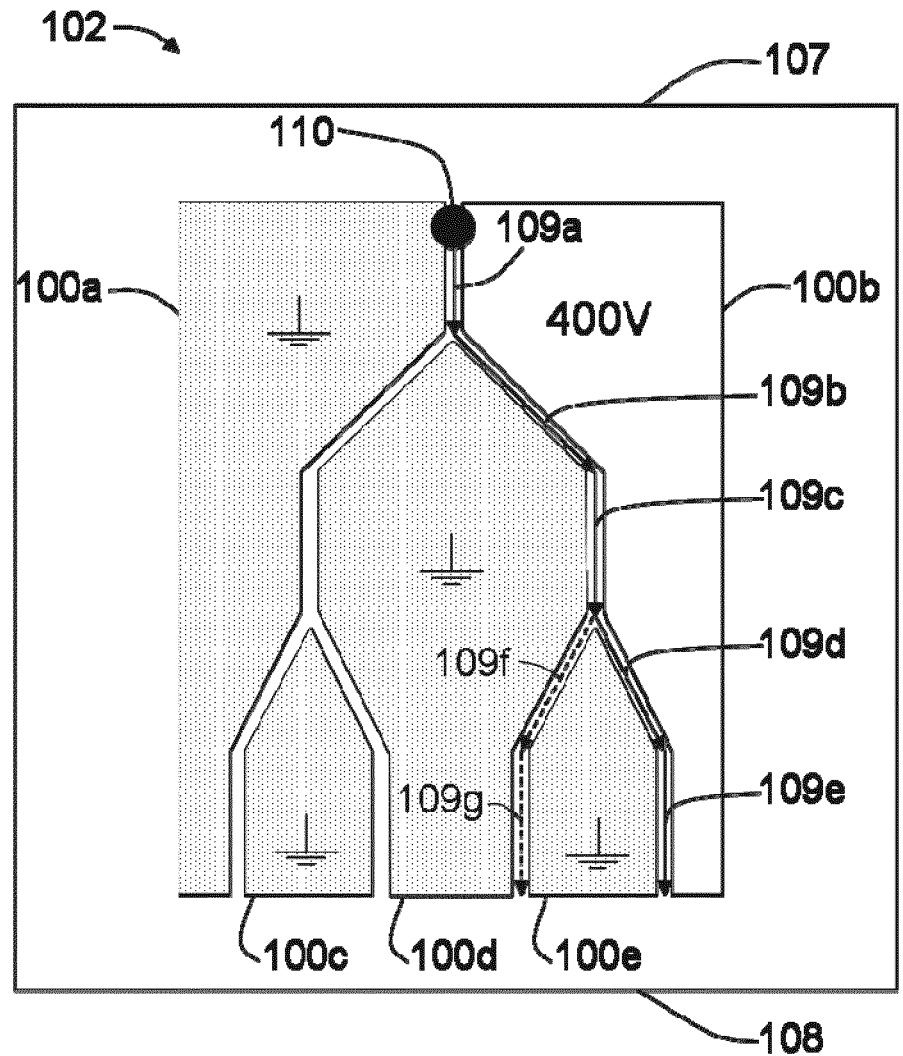
Figure 18:
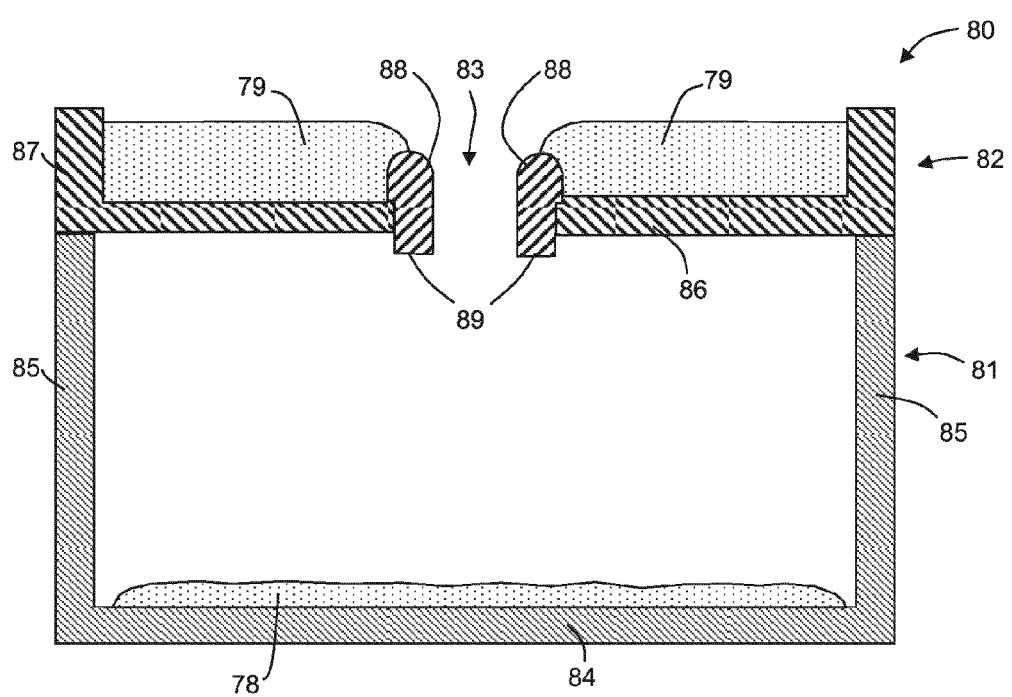
Figure 19:
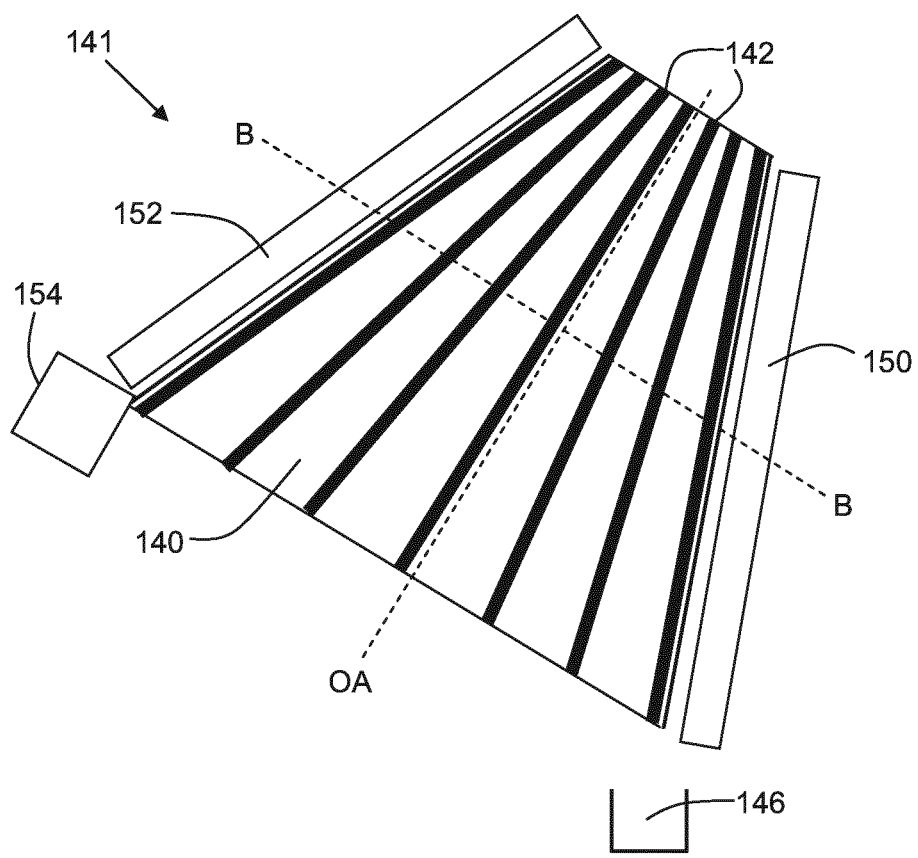
Figure 20:
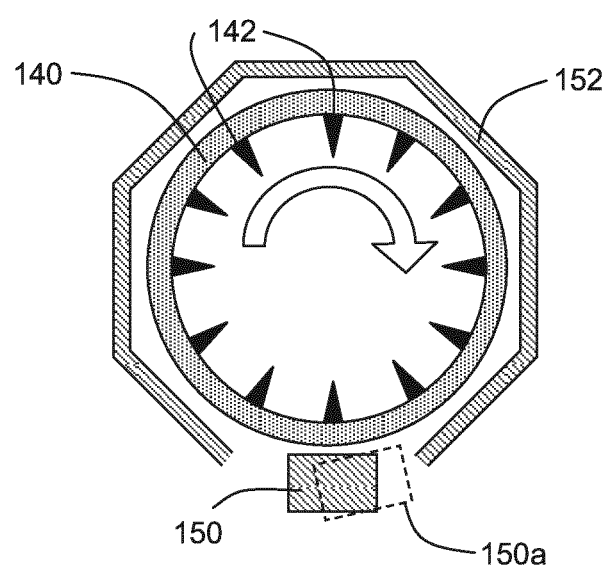
Figure 21:
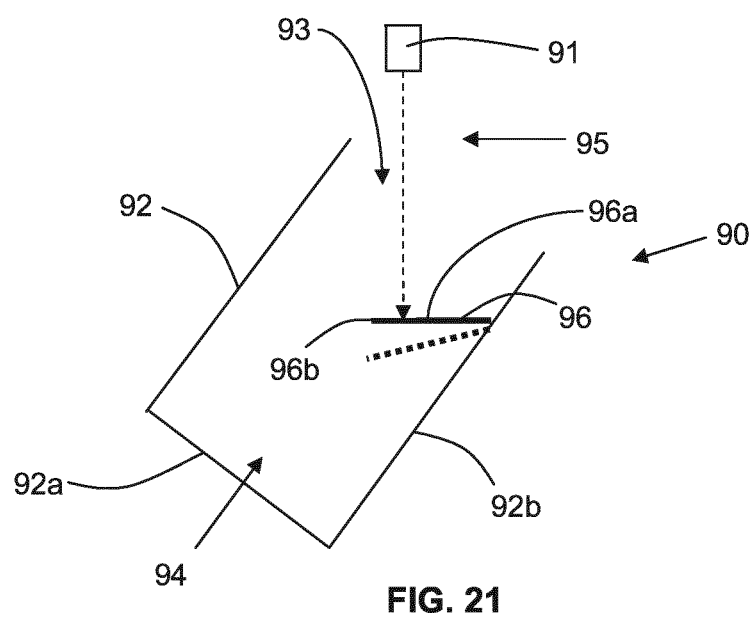
Figure 22:
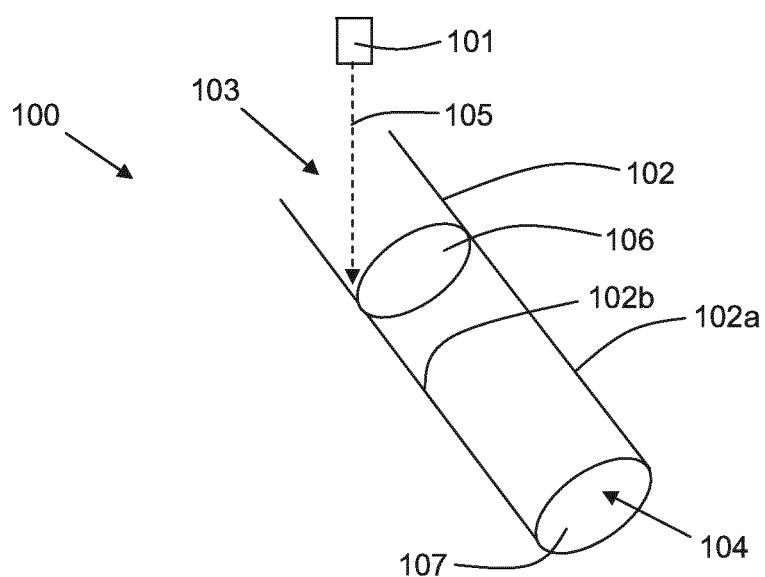

FIG. 10 schematically depicts a fuel catcher 22 according to an embodiment of the invention;

FIG. 11 schematically depicts part of a radiation source according to an embodiment of the invention;

FIG. 12 schematically depicts in more detail part of the radiation source of FIG. 11;

FIGS. 13 and 14 are graphs which represent curvature of a vane shown in FIG. 11 and an obscuration bar shown in FIGS. 3 and 4, respectively;

FIG. 15 schematically depicts a liquid fuel guiding apparatus viewed from above;

FIG. 16 schematically depicts the liquid fuel guiding apparatus of FIG. 15 in cross-section;

FIG. 17 schematically depicts the liquid fuel guiding apparatus of FIG. 15 in operation;

FIG. 18 schematically depicts a fuel collector according to an embodiment of the invention which may form part of the radiation source;

FIG. 19 schematically depicts in partial cross-section part of a radiation source according to an embodiment of the invention;

FIG. 20 schematically depicts in cross-section the part of the radiation source shown in FIG. 19;

FIG. 21 schematically depicts in cross-section a fuel collector according to an embodiment of the invention; and FIG. 22 schematically depicts in cross-section a fuel collector according to an alternative embodiment of the invention.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION

This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment", "an embodiment", "an example embodiment", etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

Before describing such embodiments in more detail, however, it is instructive to present an example environment in which embodiments of the present invention may be implemented.

Figure 1:
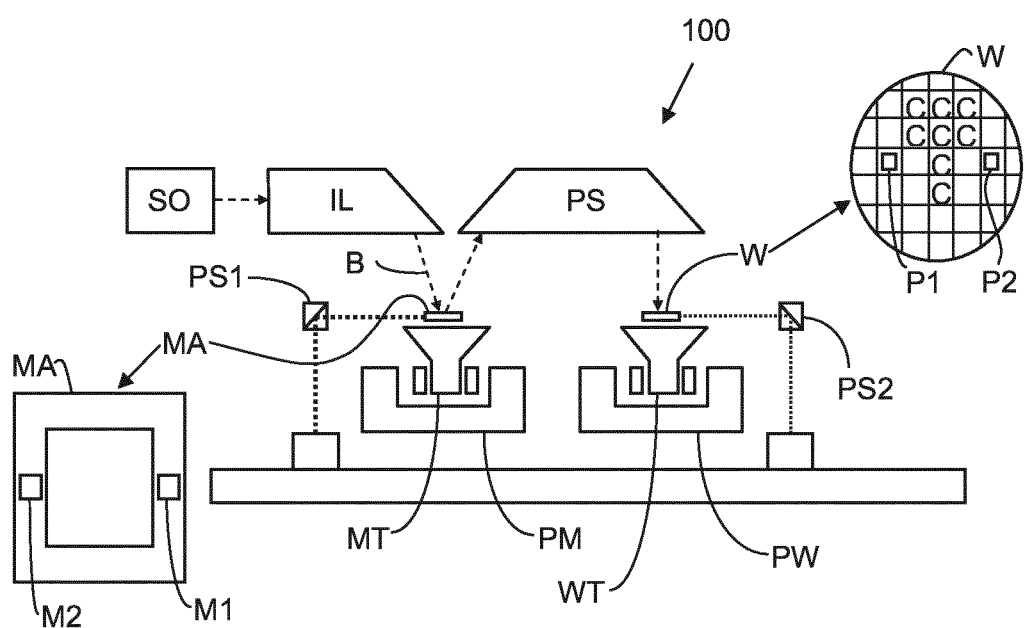

FIG. 1 schematically shows a lithographic apparatus 100 including a radiation source SO according to an embodiment of the invention. The apparatus comprises: an illumination system (illuminator) IL configured to condition a radiation beam B (e.g., EUV radiation); a support structure (e.g., a mask table) MT constructed to support a patterning device (e.g., a mask or a reticle) MA and connected to a first positioner PM configured to accurately position the patterning device; a substrate table (e.g., a wafer table) WT constructed to allow holding of a substrate (e.g., a resist-coated wafer) W and connected to a second positioner PW configured to accurately position the substrate; and a projection system (e.g., a reflective projection system) PS configured to project a pattern imparted to the radiation beam B by patterning device MA onto a target portion C (e.g., comprising one or more dies) of the substrate W.

The illumination system IL may include various types of optical components, such as refractive, reflective, magnetic, electromagnetic, electrostatic or other types of optical components, or any combination thereof, for directing, shaping, or controlling radiation.

The support structure MT holds the patterning device MA in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system.

The term "patterning device" MA should be broadly interpreted as referring to any device that can be used to impart a radiation beam with a pattern in its cross-section such as to create a pattern in a target portion of the substrate. The pattern imparted to the radiation beam may correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The projection system PS, like the illumination system, may include various types of optical components, such as refractive, reflective, magnetic, electromagnetic, electrostatic or other types of optical components, or any combination thereof, as appropriate for the exposure radiation being used, or for other factors such as the use of a vacuum. It may be desired to use a vacuum for EUV radiation since other gases may absorb too much radiation. A vacuum environment may therefore be provided to the whole beam path with the aid of a vacuum wall and vacuum pumps.

As here depicted, the apparatus is of a reflective type (e.g., employing a reflective mask and/or reflective optics).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

Referring to FIG. 1, the illuminator IL receives an extreme ultra violet radiation beam from the radiation source SO. Methods to produce EUV radiation include, but are not necessarily limited to, converting a fuel material into a plasma state that has at least one element, e.g., xenon, lithium or tin, with one or more emission lines in the EUV range. In one such method, often termed laser produced plasma ("LPP") the required plasma can be produced by irradiating a fuel, such as a droplet, stream or cluster of material having the required line-emitting element, with a laser beam. The radiation source SO may include a laser, not shown in FIG. 1, for providing the laser beam exciting the fuel (the radiation source and laser forming together a radiation system). The resulting plasma emits output radiation, e.g., EUV radiation, which is collected using a radiation collector, disposed in the radiation source. The laser and the radiation source may be separate entities, for example when a CO2 laser is used to provide the laser beam for fuel excitation.

In such cases, the laser is not considered to form part of the lithographic apparatus and the laser beam is passed from the laser to the radiation source with the aid of a beam delivery system comprising, for example, suitable directing mirrors and/or a beam expander.

In an alternative method, often termed discharge produced plasma ("DPP") the EUV emitting plasma is produced by using an electrical discharge to vaporise a fuel. The fuel may be an element such as xenon, lithium or tin which has one or more emission lines in the EUV range. The electrical discharge may be generated by a power supply which may form part of the radiation source or may be a separate entity that is connected via an electrical connection to the radiation source.

The illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as facetted field and pupil mirror devices. The illuminator may be used to condition the radiation beam, to have a desired uniformity and intensity distribution in its cross-section.

The EUV radiation beam B is incident on the patterning device (e.g., mask) MA, which is held on the support structure (e.g., mask table) MT, and is patterned by the patterning device. After being reflected from the patterning device (e.g., mask) MA, the radiation beam B passes through the projection system PS, which focuses the beam onto a target portion C of the substrate W. With the aid of the second positioner PW and position sensor PS2 (e.g., an interferometric device, linear encoder or capacitive sensor), the substrate table WT can be moved accurately, e.g., so as to position different target portions C in the path of the radiation beam B. Similarly, the first positioner PM and another position sensor PS1 can be used to accurately position the patterning device (e.g., mask) MA with respect to the path of the radiation beam B. Patterning device (e.g., mask) MA and substrate W may be aligned using mask alignment marks M1, M2 and substrate alignment marks P1, P2.

The depicted apparatus could be used in at least one of the following modes:

1. In step mode, the support structure (e.g., mask table) MT and the substrate table WT are kept essentially stationary, while an entire pattern imparted to the radiation beam is projected onto a target portion C at one time (i.e., a single static exposure). The substrate table WT is then shifted in the X and/or Y direction so that a different target portion C can be exposed.

2. In scan mode, the support structure (e.g., mask table) MT and the substrate table WT are scanned synchronously while a pattern imparted to the radiation beam is projected onto a target portion C (i.e., a single dynamic exposure). The velocity and direction of the substrate table WT relative to the support structure (e.g., mask table) MT may be determined by the (de-)magnification and image reversal characteristics of the projection system PS.

3. In another mode, the support structure (e.g., mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
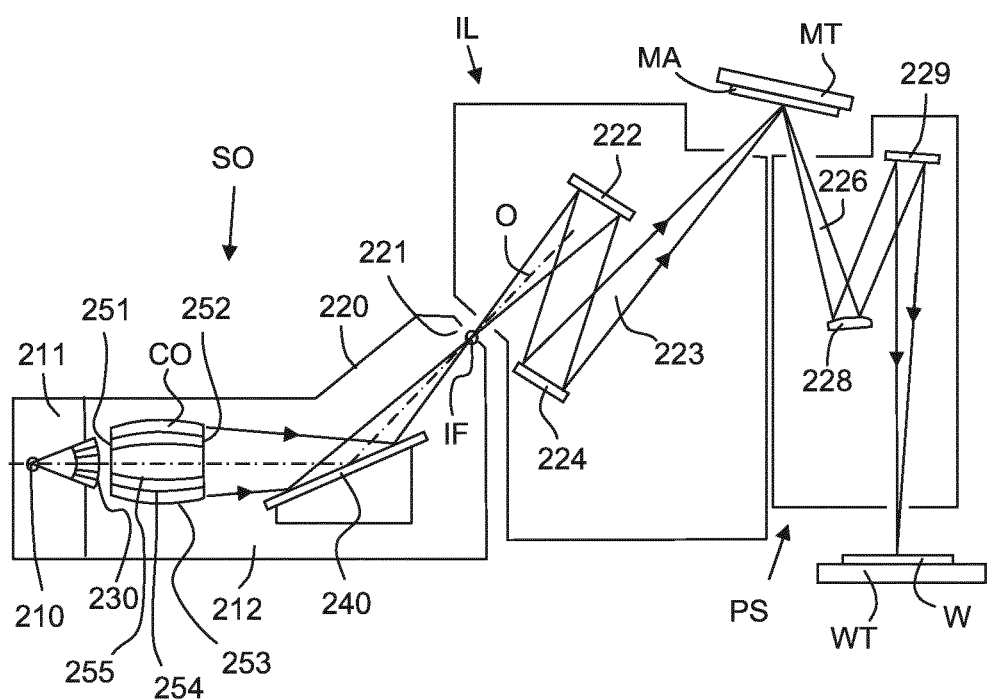

FIG. 2 shows the lithographic apparatus 100 in more detail, including the radiation source SO, the illumination system IL, and the projection system PS. The radiation source SO is constructed and arranged such that a vacuum environment can be maintained in an enclosing structure 220 of the radiation source SO. An EUV radiation emitting plasma 210 may be formed by a laser or a discharge produced plasma source. EUV radiation may be produced by a gas or vapor, for example Xe gas, Li vapor or Sn vapor in which the very hot plasma 210 is created to emit radiation in the EUV range of the electromagnetic spectrum. The very hot plasma 210 is created by, for example, an electrical discharge or by a laser beam excitation of fuel droplets, causing an at least partially ionized plasma. Partial pressures of, for example, 10 Pa of Xe, Li, Sn vapor or any other suitable gas or vapor may be required for efficient generation of the radiation. In an embodiment, a plasma of excited tin (Sn) is provided to produce EUV radiation.

The radiation emitted by the hot plasma 210 is passed from a source chamber 211 into a collector chamber 212 via an optional gas barrier or contaminant trap 230 (in some cases also referred to as contaminant barrier or foil trap) which is positioned in or behind an opening in source chamber 211. The contaminant trap 230 may include a channel structure. Contamination trap 230 may also include a gas barrier or a combination of a gas barrier and a channel structure. The contaminant trap or contaminant barrier 230 further indicated herein may at least include a channel structure, as known in the art.

The collector chamber 212 may include a radiation collector CO which may be a so-called grazing incidence collector. Radiation collector CO has an upstream radiation collector side 251 and a downstream radiation collector side 252. Radiation that traverses collector CO can be reflected off a grating spectral filter 240 to be focused in a virtual source point IF. The virtual source point IF is commonly referred to as the intermediate focus, and the radiation source is arranged such that the intermediate focus IF is located at or near an opening 221 in the enclosing structure 220. The virtual source point IF is an image of the radiation emitting plasma 210.

Subsequently the radiation traverses the illumination system IL, which may include a facetted field mirror device 222 and a facetted pupil mirror device 224 arranged to provide a desired angular distribution of the radiation beam 223, at the patterning device MA, as well as a desired uniformity of radiation intensity at the patterning device MA. Upon reflection of the beam of radiation 223 at the patterning device MA, held by the support structure MT, a patterned beam 226 is formed and the patterned beam 226 is imaged by the projection system PS via reflective elements 228, 229 onto a substrate W held by the wafer stage or substrate table WT.

More elements than shown may generally be present in illumination optics unit IL and projection system PS. The grating spectral filter 240 may optionally be present, depending upon the type of lithographic apparatus. Further, there may be more mirrors present than those shown in the Figures, for example there may be 1-6 additional reflective elements present in the projection system PS than shown in FIG. 2.

Collector optic CO, as illustrated in FIG. 2, is depicted as a nested collector optic with grazing incidence reflectors 253, 254 and 255, just as an example of a collector (or collector mirror). The grazing incidence reflectors 253, 254 and 255 are disposed axially symmetric around an optical axis O and a collector optic CO of this type may be used in combination with a discharge produced plasma source, often called a DPP source, however it may also be used in combination with laser produced plasma where fuel droplets are excited for example with laser beam energy into plasma state.

An alternative radiation source SO according to an embodiment of the invention is shown schematically in FIGS. 3 and 4. The radiation source, which is shown viewed from above in FIG. 3 and viewed from one side in FIG. 4, is an LPP radiation source.

The radiation source SO comprises a fuel droplet emitter 10 which is configured to deliver fuel droplets to a plasma formation location 12. A laser LA is arranged to deposit laser energy into the fuel droplets at the plasma formation location 12, thereby forming a highly ionised plasma 14 with electron temperatures of several 10's of eV. The energetic radiation generated during de-excitation and recombination of these ions is emitted from the plasma 14. This energetic radiation includes EUV radiation. The radiation is collected by a near normal incidence collector optic CO and focused to an intermediate focus IF, from where the radiation passes into an illumination system IL of the lithographic apparatus (see FIGS. 1 and 2).

The radiation source SO further comprises a housing 16 within which a controlled environment is provided, the plasma formation location 12 and collector optic CO being located within the housing. Control of the environment may for example comprise providing a desired vacuum within the housing 16 and/or providing one or more desired gases at desired pressures (the desired pressures may be significantly below atmospheric pressure and may thus be considered to be a vacuum). An opening 18 is provided at one end of the housing 16, the position of the opening substantially corresponding with the position of the intermediate focus IF. An opening 20 (or window) is provided at an opposite end of the housing in order to allow laser radiation to pass from the laser LA into the housing. The opening 20 may be at any suitable location, for example on a side of the housing such that the laser beam forms an angle with an optical axis O of the radiation source SO. Other openings may also be provided for further lasers needed to produce the plasma (such as another main-pulse laser for exciting the fuel and/or a pre-pulse laser for evaporating the fuel, as known in the art).

The radiation source SO includes a bar 60 which extends substantially horizontally across the interior of the housing 16 of the source and intersects with the optical axis O. The bar 60 acts to block laser radiation emitted by the laser LA, thereby preventing that laser radiation from being directly incident upon optical surfaces in the illuminator IL and projection system PS of the lithographic apparatus (see FIGS. 1 and 2). The bar 60, which may be referred to as the obscuration bar 60, is described in more detail further below.

In the following description the fuel which is emitted from the fuel droplet emitter 10 is tin. However, other fuels may be used, for example xenon or lithium.

The fuel droplet emitter 10 may be configured to operate continuously. That is, the fuel droplet emitter 10 may be heated to a temperature which is above the melting temperature of the fuel (e.g., tin), and may remain at that temperature and continuously emit droplets of fuel until replacement of the fuel droplet emitter is required. Consequently, there may be periods of time during which laser radiation is not being emitted by the laser LA but droplets of fuel continue to be emitted from the fuel droplet emitter 10. A fuel catcher 22 is provided on an opposite side of the source SO from the fuel droplet emitter 10. The fuel catcher 22 may comprise a container such as a tube which is configured to receive and retain fuel droplets which have been emitted by the fuel droplet emitter 10 and which have not been vaporised by the laser radiation.

A plurality of vanes 24*a-d* extend from the housing 16. The vanes may for example be made from molybdenum, or from stainless steel provided with a galvanic tin plating. The vanes may be provided with a surface which retains incident liquid tin (i.e. a good wetting surface for the fuel material). A tin surface (e.g., obtained using galvanic tin plating) provides affinity with liquid tin such that the surface will retain the liquid tin. The vanes may be provided with a surface which does not react significantly with liquid tin at working temperatures of the radiation source. For example, in the case of a stainless steel vane, the vane may be held at a temperature above 250° C. (at which temperature the tin may remain in a liquid state), and may be held at a temperature which is below 400° C. In the case of a molybdenum vane, the vane may be held at a temperature above 250° C., and may be held at a temperature which is below around 1100° C. (which may be the boiling point of tin at radiation source pressure). The vanes may be heated using any suitable heating apparatus (not illustrated).

Although only two vanes 24a,b are shown in FIG. 3 and two vanes 24c,d are shown in FIG. 4, more than four vanes may be provided. For example, vanes may be distributed around an inner wall of the housing 16. For example, twenty or more vanes, forty or more vanes, or sixty or more vanes may be distributed around an inner wall of the housing 16. The vanes 24a-d may extend generally radially inwards from the housing 16. The vanes 24a-d may subtend one or more angles relative to the radial direction. The vanes 24a-d may be flat. Alternatively, the vanes may include some curvature. Different vanes 24a-d may have different shapes and/or orientations relative to the radial direction, for example to take into account the angled upward orientation of the housing 16 (as shown in FIG. 4). A gutter 27 is located at one end of the vanes 24a-d. The gutter 27 may be connected to a drain (not shown). The vanes 24a-d may include support structures 29 which may be located at an opposite end of the vanes from the gutter 27.

Also extending from the housing 16 are reflective structures 26. The reflective structures 26 are located in the vicinity of the intermediate focus IF, and are configured to reflect EUV radiation. Some radiation which is incident upon the collector optic CO may be generally focused towards the intermediate focus IF, but may not be sufficiently strongly focused to pass through the intermediate focus IF. This radiation will be incident upon the reflective structures 26. The reflective structures 26 may for example be arranged to reflect this radiation back into the housing 16, thereby reducing the likelihood of radiation which is not strongly focused passing through the opening 18 and into the illumination system IL (see FIGS. 1 and 2). The reflective structures 26 may for example comprise a series of vanes which extend substantially circumferentially around the housing 16 in the vicinity of the intermediate focus IF. The reflective structures 26 may have a generally frustoconical shape.

As described further above, a tin droplet which is delivered to the plasma formation location 12 is vaporised by the laser beam emitted from the laser LA to generate a radiation emitting plasma 14. However, vaporisation of the tin droplet may be incomplete, and as a result residual droplets of tin may remain after the plasma 14 has been formed. It is desirable to reduce the likelihood of these residual tin droplets being incident upon the collector optic CO or passing through the opening 18 into the illumination system IL. The vanes 24a-d act as traps which receive the residual tin droplets, being thus an example of a fuel debris receiving surface.

The vanes 24a-d (or other vanes of the radiation source SO) may be heated by a heating apparatus. The vanes 24a-d may be heated to a temperature which is above the melting temperature of tin (e.g., to above around 230° C., e.g. to above around 250° C.). As a result, residual tin droplets which are incident on the vanes 24a-d remain in liquid form and may flow along or across the vanes. The gutter 27 receives the liquid tin from the vanes 24a-d and directs the liquid tin to a drain (not shown).

The temperature of the vanes (e.g., vanes 24a-d) may be below the evaporation temperature of tin (i.e., the temperature at which a significant degree of evaporation of tin will occur). This depends upon the pressure in the radiation source, and may for example be in the range from 1100° C. to 1600° C. It may be preferable not to cause the tin to evaporate, because the evaporated tin could travel to and condense upon other surfaces in the radiation source SO (or elsewhere), such as optical surfaces.

As will be appreciated from FIG. 4, because the radiation source SO has an angled upward orientation, some of the vanes 24c are located over the collector optic CO. Grooves are provided in the surfaces of the vanes 24, the grooves being schematically represented by lines 28. The grooves 28 have orientations which are arranged to direct the flow of liquid tin under the influence of gravity towards the gutter 27. The grooves 28 thus reduce the likelihood of liquid tin dripping from a vane 24c onto the collector optic CO. This is advantageous because accumulation of tin on the collector optic CO may modify the reflectivity of the collector optic CO in an undesirable manner.

The vanes 24 may thus be considered to be examples of immobile fuel debris receiving surfaces. Grooves may be provided in other immobile fuel debris receiving surfaces in the radiation source, such as on the walls, between vanes, on an obscuration bar surface, etc.

Droplets of liquid tin which are located close to a lowermost edge of a vane are the most likely drip off the vane. Consequently, it may be advantageous to provide grooves at, or adjacent to, a lowermost edge of a vane. It may also be advantageous to provide grooves at location(s) on a vane which are most likely to receive tin debris during operation of the radiation source.

The grooves may have a cross-sectional shape which provides capillary action and/or wicking action, thereby promoting the flow of liquid fuel into the grooves (and inhibiting the flow of liquid fuel across the grooves). The grooves may for example have a v-shaped cross-section. Alternatively, the grooves may have a rectangular cross-section, e.g., having two corners which each subtend an angle of around 90°. In this case, the two corners may provide the force which gives rise to capillary action and/or wicking action. The grooves may have any other suitable shape, which may for example provide capillary action and/or wicking action. For example, a corner may extend longitudinally along the groove, the corner giving rise to capillary action and/or wicking action.

A set of grooves 28 on a vane 24 may comprise grooves which extend substantially parallel to each other. The substantially parallel grooves may be straight or curved, or a combination of both. The grooves may also be interconnected.

Although only three grooves 28 are shown on each vane 24, this is merely a schematic example. Three or more grooves may be provided on each vane 24. For example, ten or more, or twenty or more grooves may be provided on each vane 24. The spacing between adjacent grooves may for example be 6 mm or less. 6 mm is twice the capillary length for liquid tin (capillary length is intended to mean the maximum distance from the groove at which capillary action can draw tin into the groove). Thus, if two grooves are separated by 6 mm, the entire surface between those grooves may be within the capillary length of one of the grooves. The spacing between adjacent grooves may for example be around 3 mm (i.e., the capillary length for liquid tin). The spacing between adjacent grooves may for example be 1 mm or more. A spacing of around 1 mm could effectively create a fully grooved surface.

The grooves may for example have a depth of at least 0.1 mm. The grooves may for example have a depth of up to 0.2 mm, a depth of up to 0.5 mm, or a depth of up to 2 mm. The grooves may for example have a depth of 0.5 mm.

If a groove has a v-shaped cross-section then the width of the groove will be determined by its depth and its opening angle. A groove (e.g., a v-shaped groove) may for example have a width of at least 0.1 mm. A groove (e.g., a v-shaped groove) may for example have a width of up to 0.2 mm, a width of up to 0.5 mm, or a width of up to 2 mm.

If the groove has a rectangular cross-section then the width of the groove will be independent of its depth. This allows the groove to be provided with a greater width in order to increase draining capacity provided by the groove. A rectangular groove may for example have a width of up to 0.2 mm, a width of up to 0.5 mm, a width of up to 2 mm, or a width of up to 10 mm. A rectangular groove may for example have a width of at least 0.1 mm.

Figure 5:
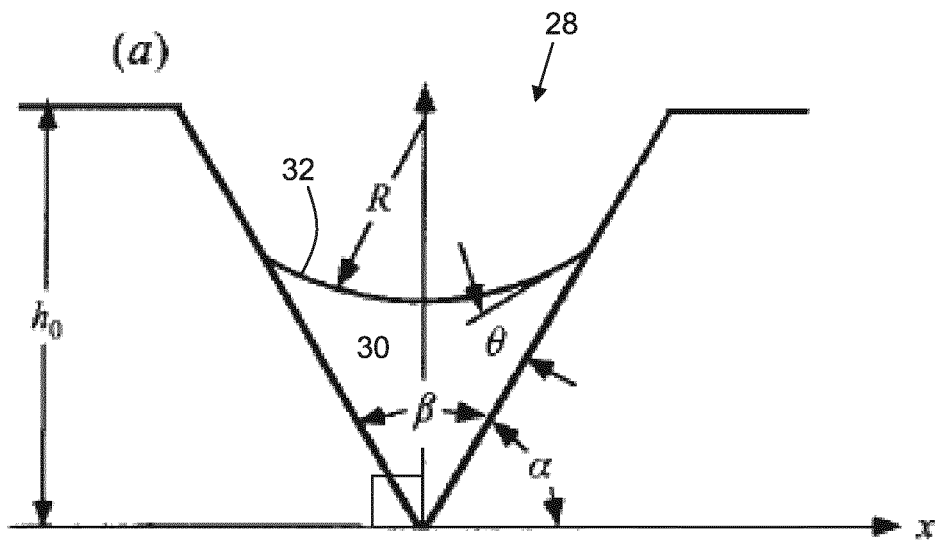

FIG. 5 shows schematically in cross-section a v-shaped groove which may for example be formed in a vane surface or another surface inside the radiation source SO in accordance with an embodiment of the invention. The v-shaped groove 28 is shown relative to an x-direction, which may for example be parallel to a surface of the vane. A normal to the x-direction is also shown. The v-shaped groove 28 has an opening angle $\beta$. Each side of the v-shaped groove 28 subtends an angle $\alpha$ relative to the x-direction (referred to hereafter as the elevation angle) such that $2\alpha+\beta=180°$. The v-shaped groove has a depth h0.

Also shown in FIG. 5 is liquid tin 30 (although also other liquid fuels can be envisaged). The liquid tin 30 has a meniscus 32 which has a radius of curvature R. The meniscus subtends an angle $\theta$ at the location where the meniscus contacts the surface of the v-shaped groove 28.

Capillary action of a droplet of liquid in a groove may cause a wetting front of the droplet to advance (i.e., for the droplet to spread out in the groove). This advance of the droplet wetting front may be characterised by the following equation:

$$D=(\sigma h_0/\mu)^{1/2}K(\theta_0,\alpha) \quad (1)$$

where D is a transport coefficient which characterises the rate of advance of the wetting front of the droplet, $\alpha$ is the surface tension of the liquid, h0 is the depth of the groove, $\mu$ is the dynamic viscosity of the liquid, and K is a geometrical function of the elevation angle $\alpha$ and the angle $\theta_0$ formed between the meniscus and the groove before the fluid starts to move. As will be appreciated from the above equation, the transport coefficient D is proportional to K.

Figure 6:
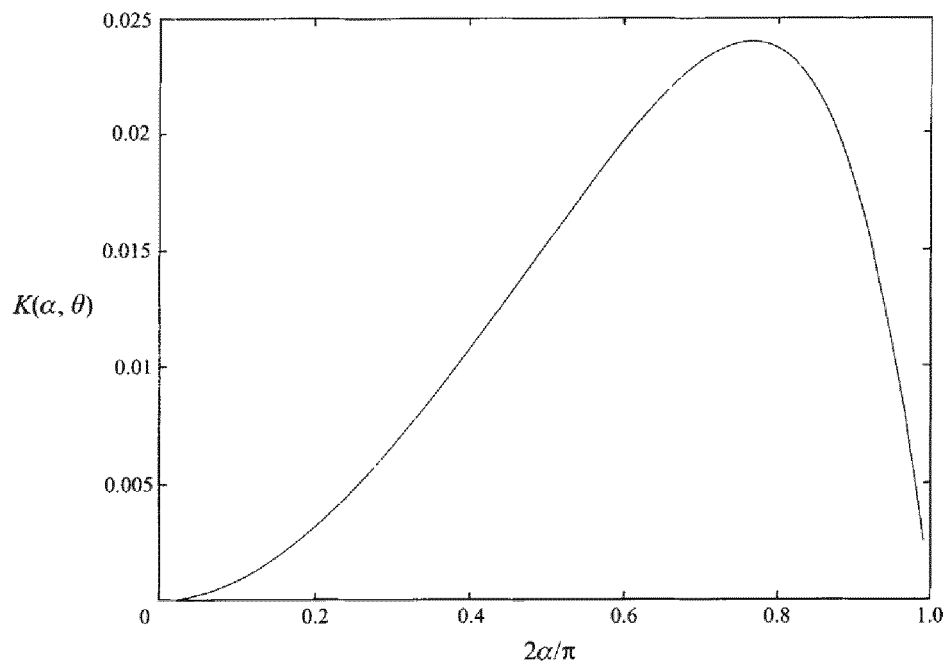

FIG. 6 is a graph which shows how K varies as a function of the elevation angle $\alpha$ (a being expressed in radians). As may be seen from FIG. 6, K passes through a maximum at an elevation angle $\alpha$ of around 70° (around 0.77 on the horizontal scale of FIG. 6). This corresponds to an opening angle $\theta$ of the groove of around 40°. Thus, capillary action of a tin droplet in the v-shaped groove may be at a maximum for a groove opening angle $\theta$ of around 40°. As will be appreciated from FIG. 6, other opening angles $\beta$ may also give rise to significant capillary action. The groove opening angle $\beta$ may for example be in the range 30°-50°, and may for example be in the range 20°-60°.

More information regarding the effect of the shape of a groove upon liquid flowing into the groove may be found in L. A. Romero et al, J. Fluid Mech. (1996), vol. 322, pp 109-129, which is herein incorporated by reference.

As explained above, the capillary action provided by a v-shaped groove 28 may cause a tin droplet to spread out along the groove. In addition, the v-shaped groove 28 may draw liquid tin into the v-shaped groove from a surrounding area. This may occur for example if part of a liquid tin droplet overlaps with the groove and part of the liquid tin droplet does not overlap with the groove. A wicking action arising from force generated by the liquid tin in the groove will draw the droplet into the groove. This drawing of a liquid tin droplet into the groove via wicking action is advantageous because it prevents or inhibits the flow of liquid tin across the groove.

Referring to FIG. 4, if liquid tin is received on a vane 24c which is located above the collector optic CO, gravity will urge that liquid droplet to flow downwards towards a bottom edge of the vane. In the absence of the grooves 28 there would be a risk that the liquid tin would drip from the vane 24c and be incident upon the collector optic CO. However, when the liquid tin flows over a groove 28 (e.g., a v-shaped groove), the wicking action provided by the groove will draw the liquid tin into the groove, and will inhibit the liquid tin from continuing to flow downwards and across the vane 24c. The groove 28 directs the flow of liquid tin under the influence of gravity towards the gutter 27. The vane 24c is thus configured to receive liquid tin and direct that liquid tin via grooves 28 to the gutter 27. In addition to gravity, capillary action in the grooves 28 may also drive flow of liquid tin towards the gutter 27.

In the case of a groove having a rectangular cross-section, flow resistance due to a side wall of the groove may prevent overrunning of fluid in a direction which runs across the groove (i.e., the flow resistance may keep the fluid within the groove). The fluid will follow the direction of the groove, being directed along the groove under the influence of gravity. Corners running along the rectangular groove may also give rise to capillary action and/or wicking action. In general, a corner (i.e. an edge) which runs along a groove may give rise to capillary and/or wicking action.

The grooves 28 in the right hand vane 24d of FIG. 4 also promote the flow of liquid tin, such that the liquid tin flows into the gutter 27. In this instance the vane does not extend above the collector optic CO, and has an orientation which is closer to vertical than the vane 24c referred to above. The grooves 28 may therefore not be required to prevent dripping of liquid tin onto the collector. Nevertheless, the grooves 28 may direct the flow of liquid tin under the influence of gravity towards the gutter 27.

In general, the grooves 28 are oriented such that they direct the flow of liquid tin under the influence of gravity towards the gutter 27. The grooves 28 may be configured to cause the liquid tin to flow more rapidly than would be the case if the grooves were not present. This may allow the vanes 24 to receive liquid tin at a greater flow rate than would otherwise be possible, without that liquid tin filling the vanes and giving rise to dripping of excess liquid tin onto the collector optic CO (or onto other surfaces).

Figure 7:
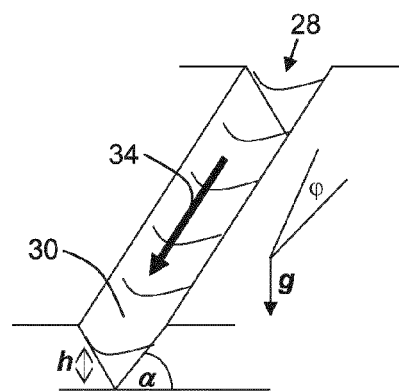

The effect of gravity on the flow of liquid tin received by the vanes 24 is considered below. FIG. 7 schematically shows a v-shaped groove 28 which is tilted relative to the horizontal such that gravity promotes the flow of liquid tin 30 along the v-shaped groove, as indicated by arrow 34. A downwardly pointing arrow g schematically represents gravitational force. The angle $\phi$ of the groove 28 relative to the horizontal is also represented schematically (this angle is hereafter referred to as the tilt angle $\phi$, which can also be represented as angle (90°−$\phi$) relative to the vertical direction of the gravity force). In the situation shown in FIG. 7 the liquid tin 30 may flow through the v-shaped groove 28 due to a pressure gradient p7 which is induced by gravity. The volumetric flux q of the liquid tin (i.e., rate of flow of liquid tin) is given by:

$$q = -\frac{h^4}{\mu}\Gamma(\vartheta_0, \alpha)\rho g \sin\varphi \qquad (2)$$

where h is the depth of the groove, μ is dynamic viscosity of the liquid tin, Γ is a geometrical function of the elevation angle α and the angle $\theta_0$ formed between the meniscus and the groove before the liquid tin starts to move, ☐☐ is the density of the liquid tin, g is acceleration due to gravity, and φ is the tilt angle of the groove. Additional information regarding the flow of liquid along a groove due to gravity may be found in the paper by Romero et al referred to further above.

Figure 8:
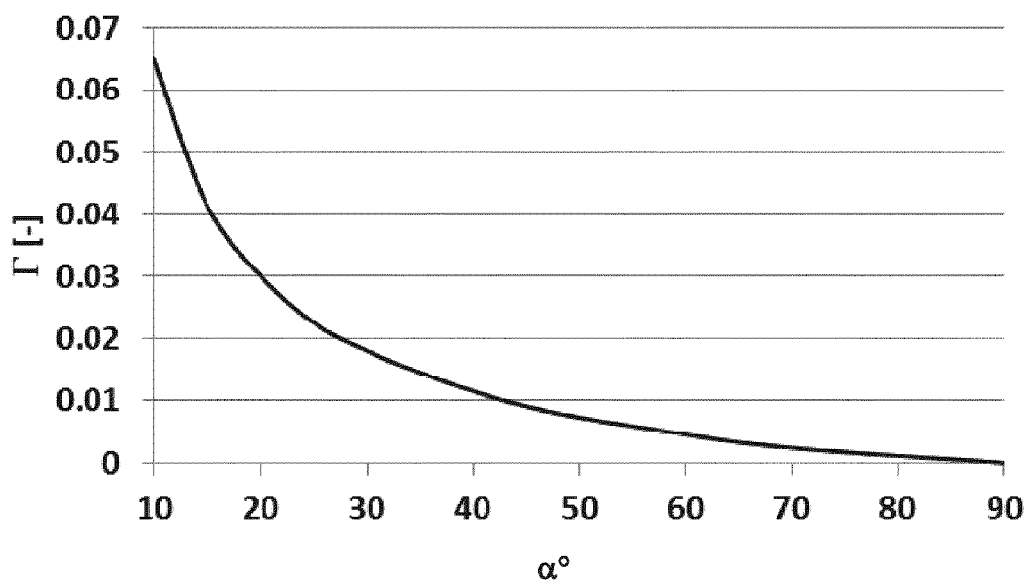
FIG. 8 is a graph which represents the effect of changing an angle subtended by the groove.

FIG. 8 is a graph which shows how the geometrical function Γ varies as a function of the elevation angle α of the groove. As may be seen, the geometrical function Γ, and hence the volumetric flux (which is proportionate to this function), is greatest for a small elevation angle α and reduces as the elevation angle α increases.

FIG. 8 taken in combination with FIG. 6 indicates that there may be a trade-off between the volumetric flux of liquid tin provided by a groove and the capillary action provided by the groove (due to the effect of the elevation angle α). An elevation angle α of around 70° will cause liquid to be strongly drawn into a groove, and for a liquid droplet to spread out quickly along that groove. However, an elevation angle α of around 70° may significantly reduce the flow rate of liquid along the groove, compared for example with an elevation angle α of 20° (as demonstrated by FIG. 8).

Figure 9:
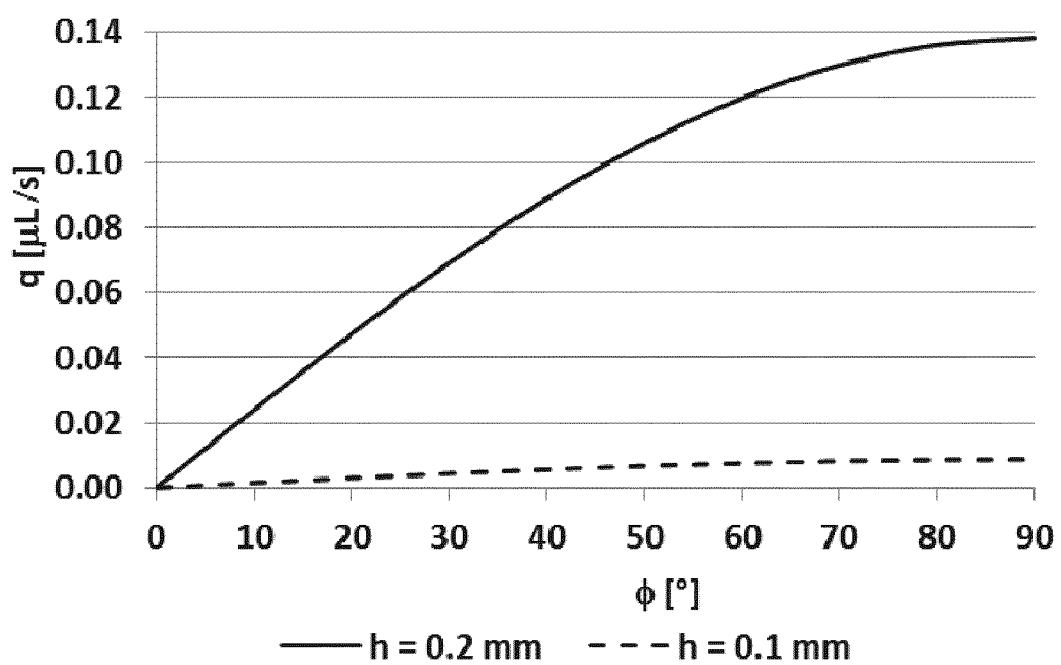
FIG. 9 is a graph which represents the effect of changing an angle at which the groove is tilted, and the effect of changing the depth of the groove.

As may be seen from equation (2), the volumetric flux of the liquid scales to the 4th power of the depth of the groove. Therefore, the depth of the groove has a stronger effect upon the volumetric flux than the elevation angle α. This may be seen from FIG. 9 which is a graph which shows how the volumetric flux varies as a function of the tilt angle φ of the groove (see FIG. 7) for grooves with two different depths. Both grooves have an elevation angle α of 70°. As may be seen, the volumetric flux increases as the tilt angle φ increases. The graph in FIG. 9 shows the volumetric flux for a groove having a depth of 0.1 mm and a groove having a depth of 0.2 mm. As may be seen, the volumetric flux for the groove having a depth of 0.2 mm is very much greater than the volumetric flux for the groove having a depth of 0.1 mm.

Since the effect of the depth of the groove on the volumetric flux is stronger than the effect of the elevation angle α, grooves formed in the vanes 24 may for example be formed with a elevation angle α which gives rise to a desired capillary effect (e.g., an angle of around 70°), and the depth of the groove may then be selected in order to provide a desired volumetric flux.

In an alternative approach, for a groove 28 which requires strong capillary action to retain liquid tin, the elevation angle α may be given priority, whereas for a groove which does not require strong capillary action the flow rate may be given priority. Referring to FIG. 4, the grooves 28 which are located on the vane 24c above the collector optic CO may be considered to be grooves which require strong capillary action. The grooves 28 which are located on the vane 24d to the right hand side of the source SO may be considered to be grooves which do not require strong capillary action (because the orientation of the grooves is close to vertical).

If the grooves 28 were not present on the vanes 24, then an imperfection such as a scratch could inhibit or prevent passage of tin in a desired direction on a vane. For example, a vertical scratch on the vane 24c which is above the collector optic CO in FIG. 4 could inhibit movement of liquid tin towards the gutter 27, and could promote downward movement of the liquid tin (and subsequent dripping onto the collector optic CO). This may be prevented by the grooves 28, provided that the grooves are deeper than any scratches (which may be expected to be the case).

In the absence of the grooves 28, droplets of tin (or other fuel) with a diameter of between 10 microns and 10 mm could accumulate on the vanes 24. When the grooves are present in the vanes 24, the maximum size of tin droplets formed on the vanes 24 may be limited by the grooves, due to the wicking action of grooves drawing tin into the grooves (described further above).

In the this description the grooves 28 have been described as being provided on the vanes 24. This may include providing grooves on the support structures 29 which form part of the vanes.

Grooves may be provided at other locations within the radiation source SO. For example, grooves may be provided in a wall of the radiation source housing 16. Grooves may be provided between vanes 24 which extend from the housing. Grooves may be provided on any immobile fuel debris receiving surface within the radiation source SO. In this context, the term "fuel debris receiving surface" may be interpreted as meaning a surface which receives fuel debris (e.g., liquid tin droplets) during operation of the radiation source. The term "immobile" may be interpreted as meaning that the surface does not move during operation of the radiation source.

Grooves may be provided on the reflective structures 26. The reflective structures 26 may be considered to be vanes. The grooves may for example extend substantially circumferentially around the reflective structures 26, or may extend radially, or may have a compound partially radial and partially circumferential shape. The grooves may have any other suitable form. The grooves may have orientations which are arranged to direct the flow of liquid tin, under the influence of gravity, to a drain (not shown).

In an embodiment, the tin catcher 22 may be provided with a series of vanes, for example as shown schematically in FIG. 10. The vanes 36 may extend inwardly from walls of the tin catcher 22, and may be configured to reduce the likelihood of liquid tin which enters the tin catcher splashing back out of the tin catcher. The vanes 36 may be provided with grooves which have orientations which are arranged to direct the flow of liquid tin in a desired direction (e.g., towards the bottom of the tin catcher). In an embodiment, the vanes 36 may comprise one or more helixes which extend around an inner circumference of the tin catcher 22. One or more grooves may extend along substantially all of a given helical vane 36. The grooves may have any suitable form.

Grooves may be provided on vanes at other locations in the radiation source SO.

The grooves provided on the reflective structures 26 or on vanes 36 of the tin catcher 22 (or on other surfaces) may have one or more of the properties referred to further above in relation to the vanes 24.

The grooves may be inclined relative to the horizontal, in order that a component of force due to gravity causes liquid tin to flow along the grooves.

The grooves may be considered to direct the flow of liquid tin under the influence of gravity.

In this description, the term "elevation angle" is not intended to imply that the vane surface in which the groove is formed must be horizontal.

FIG. 11 shows schematically viewed from one side in partial cross-section a substantially conical portion of a radiation source housing 40. Other parts of the radiation source are not shown, but may correspond with parts of the radiation source SO shown in FIG. 4. A plurality of vanes 42 extend inwardly from the housing 40. The vanes 42 may be distributed around the housing 40. Although seven vanes are shown in FIG. 11, this is merely a schematic illustration and any suitable number of vanes may be provided. For example, twenty or more vanes, forty or more vanes or sixty or more vanes may extend inwardly from the housing 40. A gutter 44 is located at a bottom end of the vanes 42. A tin collector 46 is connected to the gutter 44.

A liquid tin inlet 48 is located at or adjacent to upper ends of the vanes 42. The liquid tin inlet 48 delivers a flow of liquid fuel onto the vanes 42. Liquid tin delivered via the liquid tin inlet 48 flows along and/or between the vanes 42 and is received in the gutter 44, from where it flows into the tin collector 46 (i.e. a tin catcher such as catcher 22 in FIG. 3).

The portion of FIG. 11 which is enclosed by a dotted elliptical line is shown schematically in more detail in cross-section in FIG. 12. Two vanes 42 are shown in FIG. 12. Part of the liquid tin inlet 48 is also shown. The liquid tin inlet 48 comprises openings 50 between the vanes 42 through which a flow of liquid tin is delivered. The openings 50 are connected to a conduit 52 which acts as a supply of liquid tin to the openings 50. The conduit 52 may be connected to a reservoir or some other source of liquid tin.

A heater, in this case heating elements 54, is located behind the conduit 52. The heating elements heat the conduit 52 and the vanes 42 such that they are both above the melting temperature of tin, thereby ensuring that the tin remains in liquid form. The heating elements 54 may for example heat the conduit 52 and vanes 42 to a temperature between 250° C. and 350° C. Part of the housing wall 40 is also shown in FIG. 12.

In use, liquid tin is delivered via the conduit 52 into the openings 50 during operation of the EUV lithographic apparatus. The liquid tin is represented by grey shading 55 in FIG. 12. The tin is maintained in liquid form by the heating elements 54. On flowing through the openings 50 the liquid tin 55 is delivered onto tin debris-receiving surfaces of the vanes 42 (i.e., outer surfaces of the vanes). A coating of liquid tin 55 is thereby provided on the vanes 42. The coating of liquid tin is not stationary, but rather flows downwards along the vanes. This is indicated schematically by arrows 56 in FIG. 11. This downward flow of the coating of liquid tin is due at least in part to gravity. When the liquid tin reaches the bottom of the vanes 42 it enters the gutter 44 and then flows into the tin collector 46. Liquid tin may be returned from the collector to the liquid tin inlet 48 and thereby reintroduced onto the tin debris receiving surfaces of the vanes 42. The liquid tin inlet 48 may be configured to provide a flow of liquid tin to the tin debris receiving surface of the vanes 42. The flow of liquid tin may for example be a continuous supply of liquid tin. The flow of liquid tin may ensure that the tin debris receiving surface of the vanes 42 is continuously covered with a coating of liquid tin. The coating of liquid tin may ensure that the tin debris receiving surface of the vanes 42 is a good wetting surface.

The term "wetting" refers to the ability of a liquid to maintain contact with a solid surface, arising from intermolecular interactions when the liquid and solid surface are brought together. Adhesive forces between a liquid and solid will tend to cause a liquid drop to spread across the solid surface. Cohesive forces within the liquid will tend to cause the liquid drop to take a spherical form and avoid contact with the solid surface. In an EUV lithographic apparatus, as has been explained further above, it may be desirable to retain liquid tin debris on a debris-receiving surface, and conversely it may be undesirable for the liquid tin debris to drip off the debris-receiving surface. Thus, it may be desirable to ensure that the debris-receiving surface is a good wetting surface.

The vanes 42 may be made from stainless steel. Stainless steel may have poor wetting properties. Therefore, tin debris receiving surfaces of the vanes 42 may be pre-coated with a layer of tin (tin is a good wetting surface). However, it may be the case that during operation of the EUV lithographic apparatus the layer of tin provided on the stainless steel vanes will drain away, leading to exposed areas of stainless steel surface. Such exposed areas of stainless steel surface are undesirable because, due to the poor wetting nature of stainless steel, they may interfere with the flow of liquid tin debris to the gutter 44. For example, an exposed stainless steel area may inhibit flow of liquid tin, causing liquid tin to accumulate above the exposed stainless steel area. This accumulation of tin could become sufficiently large that it drips off the vane due to gravity. This is undesirable because the drip could for example be incident upon the collector optic CO (see FIG. 4) of the radiation source SO, thereby compromising the effectiveness of the collector.

The embodiment of the invention shown in FIGS. 11 and 12 overcomes the above problem by providing a flow of liquid tin through liquid tin inlets 48, such that a coating of liquid tin is maintained on the vanes 42. The liquid tin prevents or inhibits stainless steel of the vanes from becoming exposed. Thus, a good wetting surface (i.e., liquid tin) is present on the vanes. The good wetting surface promotes the controlled flow of liquid tin debris as a thin coating, such that the liquid tin debris flows into the gutter 44 (not shown). Liquid tin may be provided to other debris receiving surfaces, as described further below.

The liquid tin inlet 48 may comprise openings 50 located between vanes 42, as schematically shown in FIG. 12. Although only one opening 50 is shown between each vane 42, a plurality of openings may be provided between the vanes. In an embodiment, the liquid tin inlet 48 may comprise one or more arrays of micro-pores. The micropores may for example have diameters of the order of 100 μm. The liquid tin inlet 48 may comprise a series of openings distributed around the circumference of the housing 40. The openings 50 may for example be located between the vanes 42 or adjacent to the vanes. The openings 50 may for example be located at or adjacent to upper ends of the vanes 42. The openings may be provided at any other suitable location. The liquid tin inlet 48 may have any suitable form.

The liquid tin inlet 48 may be connected to a fuel debris receiving surface, for example opening directly onto the fuel debris receiving surface or opening onto a surface which is connected to the fuel debris receiving surface (e.g., such that the liquid tin flows over that surface and onto the fuel debris receiving surface). The liquid tin inlet 48 may comprise one or more openings which are spaced apart from the fuel debris receiving surface, for example such that liquid tin falls under the influence of gravity onto the fuel debris receiving surface. The liquid tin which falls onto the fuel debris receiving surface, which may be in the form of a continuous stream, may be considered to be an example of a flow of liquid fuel onto the debris receiving surface.

The vanes 42 may extend radially inwards towards an optical axis of the radiation source. The vanes may have a concave shape. The vanes may have sharp tips. The vanes may have a shape which is arranged to minimise surface area that is perpendicular to the radial direction, thereby minimising the likelihood of tin debris bouncing directly back from a vane into the radiation source. The vanes may be straight, as shown in FIG. 11, or may be curved.

The vanes 42 may be provided with a curved surface which leads to a non-uniform capillary pressure that draws the liquid tin 55 away from tips of the vanes. This may be advantageous because it prevents the build-up of large amounts of liquid tin 55 at tips of the vanes 42, whilst maintaining a coating of liquid tin on the vanes and thereby maintaining a good wetting surface.

FIG. 13 is a plot which shows an example of a vane profile which could be used. The vane 42 extends downwardly in FIG. 13, the interior of the radiation source (not shown) being below the line of the plot. The openings 50 are not shown in the plot (they may for example be upstream of the vane profile shown in the plot). The curvature of the vane 42 is at a maximum at the tip of the vane, and decreases as the distance from the tip of the vane increases. As a result of this curvature, a gradient in the capillary pressure of a thin layer (which may be considered to be a coating) of liquid tin of around 0.7 mbar/mm will be generated. This is around the same magnitude as the pressure gradient which is due to the effect of gravity. Thus, the shape of the vane 42 shown in the plot of FIG. 13 will inhibit or prevent gravity causing the accumulation of liquid tin at the tip of the vane. Instead, a coating of liquid tin 55 will be provided in the vicinity of the tip of the vane, with the remainder of the liquid tin being drawn into a space 45 between adjacent vanes 42. The coating of liquid tin 55 may for example have a thickness of around 100 microns or less (unwanted dripping from the vane tip may occur for coating thicknesses which are well in excess of this value).

As may be seen from FIG. 13, there is a corner 43 on either side of the vane 42 at the position where that vane meets a neighbouring vane. Spaces 45 between the vanes 42 may be considered to be grooves 45. In the vicinity of the corners 43, the profile of the vane 42 is substantially linear. The corners 43 of the grooves 45, together with the shape of the profile in the vicinity of the corners 43 thus form v-shaped grooves. The v-shape of the grooves 45 generates capillary pressure in the liquid tin which retains liquid tin in the grooves by drawing the liquid tin into the grooves. The capillary pressure also promotes spreading of liquid tin along the grooves 45, leading to a fill level 58 of liquid tin being established (see FIG. 12).

The vanes 42 of the embodiment shown in FIGS. 12 and 13 may be separated by 6 mm or less. As noted further above, 6 mm is twice the capillary length for liquid tin (for other fuels the capillary length may be different). For a given separation between vanes 42, the heights of the vanes may be selected such that a gradient of curvature may be established in the vicinity of the tips of the vanes which prevents or inhibits the accumulation of liquid tin at the tips of the vanes. Thus, for vanes 42 which are separated by around 6 mm, the vanes may for example have a height of around 3 mm. This may provide sufficient height to accommodate a non-uniform curvature which generates capillary pressure that draws liquid tin away from tips of the vanes 42. The vanes 42 may have any suitable height. Selection of the height of the vanes 42 may take into account the extent to which the vanes reduce or prevent back-scattering of liquid tin that has been incident upon the vanes 42 (a greater height may be more effective in reducing or preventing back-scattering). The height of the vanes 42 may be of the order of the capillary length of liquid tin.

As noted above, the separation between vanes 42 may be less than 6 mm. Small separations between vanes may be more difficult to manufacture, and manufacturability may thus limit the extent to which the separation between the vanes 42 can be reduced. In addition, smaller separations between vanes may reduce the gradient of curvature which can be provided on the vanes (for a given vane height).

The grooves 45 between the vanes 42 have orientations which direct the flow of liquid tin under the influence of gravity towards the gutter 44. The grooves 45 may trap incident liquid tin debris.

Some of the coating of liquid tin 55 in the vicinity of the tip of the vane 42 may be provided by liquid tin provided from the liquid tin inlet 48, and some of the coating of liquid tin may be provided by liquid tin debris. When liquid tin debris is incident upon the vane 42, excess liquid tin is automatically drawn towards the base of the vane by capillary pressure. The excess liquid tin will then join liquid tin which is flowing along the base of the vane 42, and will be guided to the gutter 44.

Referring again to FIG. 12, the curvature of the vanes 42 may be such that liquid tin 55 will tend to accumulate at a base of the vanes. The liquid tin 55 may fill an area at the base of the vanes to a level 58 which is determined, at least in part, by the rate at which liquid tin is delivered by the liquid tin inlet 48. The rate at which the liquid tin is supplied by the liquid tin inlet 48 may be selected such to provide a desired fill level 58. For example, liquid tin 55 may be delivered via the liquid tin inlet 48 at a rate which provides a fill level of 1 mm or less (or some other value). Delivery of too much liquid tin 55 via the liquid tin inlet 48 may be undesirable because it could lead to a fill level 58 which is undesirably high, and thus lead for example to dripping of tin from the vanes 42. The liquid tin 55 may automatically distribute to a fill level 58 along the direction of flow of the liquid tin, due to capillary pressure effects generated by the groove defined between the vanes 42.

In an alternative embodiment (not illustrated) liquid tin may be supplied via a liquid tin inlet to a radiation source wall which is not provided with vanes, or to some other tin debris receiving surface (such as exemplified above). Where this is the case, the supply of liquid tin will maintain the wetting nature of the debris receiving surface in the manner described above, thereby inhibiting the accumulation of tin on the surface and possible subsequent dripping of the tin from the surface.

In an embodiment, a liquid tin inlet may be arranged to supply liquid tin to a surface such as a wall which does not have vanes or other structures. Where this is the case, the wall may be arranged such that parts of the wall which receive liquid tin do not include any horizontal portions. The wall may be arranged such that parts of the wall which receive liquid tin subtend an angle of 20° or more relative to the horizontal, and may be arranged such that parts of the wall which receive liquid tin subtend an angle of 30° or more relative to the horizontal (i.e. subtend an angle of 60° or less relative to the vertical direction of the gravitational force). This may prevent or reduce dripping of liquid tin from the wall. The rate of supply of liquid tin from the liquid tin inlet may be selected to keep the thickness of the coating of liquid tin on the wall at around 100 microns or less.

Liquid tin may be supplied via a liquid tin inlet for example to reflective structures which are located in the vicinity of the intermediate focus IF (e.g., reflective structures 26 described further above in connection with FIGS. 3 and 4). The reflective structures may be fuel debris receiving surfaces.

Liquid tin may be supplied via a liquid tin inlet for example to an outer surface of the fuel droplet emitter 10 (see FIG. 3). The outer surface of the fuel droplet emitter (e.g., a fuel droplet emitting nozzle) may be a fuel debris receiving surface.

Liquid tin may be supplied via a liquid tin inlet for example to vanes 24 provided with grooves 28 (described further above in connection with FIGS. 3 and 4). The vanes 24 may be fuel debris receiving surfaces.

In an embodiment, the one or more liquid tin inlets referred to above may be used to deliver a liquid other than liquid tin. The liquid tin inlets may thus be considered to be liquid inlets generally. The liquid inlets may be used to deliver any suitable liquid. For example, Galinstan may be introduced through the liquid inlets. Galinstan is available from Geratherm Medical AG of Germany, and comprises gallium, indium and tin. The Galinstan preferably has such a concentration of components that the tin debris dissolved in it will be still in low proportion, to avoid solidifying. These components may for example be provided in the following proportions: around 68% gallium, around 22% indium and around 10% tin.

Galinstan has a melting point of −19° C., and thus is in liquid form at room temperature (e.g. around 20° C.). Consequently, Galinstan may be arranged to flow down surfaces of the housing 40 when the housing is at room temperature. Galinstan is a good wetting material, and thus may form a coating on a surface over which it is flowing. Tin debris which is incident upon the Galinstan may be captured by the Galinstan and flow down surfaces of the housing 40 (e.g. in the manner described above). In this way, the tin debris is captured and delivered to the tin collector 46 (along with the Galinstan). This capture of the tin debris is achieved without having to heat the housing 40 to a temperature above the melting temperature of tin (e.g. to above around 200° C.).

Not heating the housing 40 is advantageous for a variety of reasons. For example, if maintenance of a heated housing is needed there is a time delay incurred waiting for the housing to cool down before it can be handled. This is avoided if the housing is unheated. Similarly, following maintenance of a heated housing a time delay is incurred waiting for the housing to heat up to an operational temperature. Again, this is avoided if the housing is unheated. A further advantage is that heaters and associated control electronics are not required, thereby simplifying the construction of the housing. A further advantage is that outgassing, which tends to increase with temperature, is reduced in the housing.

Cooling of the housing 40 using for example water or other liquid may be used to dissipate heat generated as a by-product of EUV radiation generation. The cooling may for example be used to maintain at least part of the housing below 350° C., such as at room temperature (or any other suitable temperature).

The Galinstan may be supplied periodically or continuously. The Galinstan may be provided at a sufficient rate that tin which is incident upon the Galinstan does not significantly alter properties of the Galinstan. Tin which is incident upon the Galinstan and dissolves into the Galinstan could change the constitution of the Galinstan such that it is no longer liquid at room temperature. This may be avoided by providing Galinstan at a sufficiently high rate, taking into account the rate at which tin debris is incident upon surfaces of the housing 40. This may for example be determined experimentally, In an embodiment, the vanes 42 may be formed from a porous metal, and the Galinstan may be supplied from within the vanes. For example the housing may be configured such that Galinstan travels through the vanes and passes out of front surfaces of the vanes. The Galinstan may for example be delivered into the vanes 42 from a rear surface of the vanes. An advantage of delivering Galinstan through a porous metal is that this will automatically deliver more Galinstan to locations that receive the most tin debris. This is because a location which receives a lot of tin debris will have more Galinstan drawn to it from the porous metal due to the higher flow of dissolved tin debris (and Galinstan) from this location. Conversely, a location which receives little tin debris will experience little flow of dissolved tin debris (and Galinstan) and will therefore have less Galinstan drawn to it. The use of porous metal in this manner is not limited to Galinstan; porous metal may for example be used to deliver liquid fuel or some other metal or alloy.

Other alloys or metals which are liquid at room temperature may be used instead of Galinstan. For example Mercury could be used. Galinstan provides advantages over Mercury in that it is non-toxic and is capable of dissolving more tin than Mercury.

Although described in the context of vanes of the housing, Galinstan, or some other alloy or metal which is liquid at room temperature, may be used to capture tin (or other fuel) at any suitable location.

FIG. 14 shows schematically in cross-section the obscuration bar 60 shown in FIGS. 3 and 4. The optical axis O of the radiation source is also shown in FIG. 14. As may be seen from FIG. 14, the obscuration bar 60 intersects with the optical axis O. The obscuration bar 60 comprises two faces 62 upon which radiation emitted from the laser LA (see FIGS. 3 and 4) is incident. The faces 62 may be arranged to reflect the laser radiation away from the intermediate focus IF of the radiation source SO. The faces 62 may in addition arranged such that they do not directly reflect laser radiation back into the laser LA (such direct reflection could give rise to instability in the operation of the laser). The faces 62 of the obscuration bar 60 join together to form an edge 64. The edge 64 may intersect with the optical axis O of the radiation source.

As mentioned above, the obscuration bar 60 blocks laser radiation emitted by the laser LA. In addition, the obscuration bar 60 blocks EUV radiation emitted from the plasma 14. Furthermore, residual tin droplets which remain after the plasma 14 has been formed will be incident upon the obscuration bar 60. The obscuration bar 60 includes grooves 66 which receive the residual tin and direct it towards a gutter, drain or other receptacle.

The obscuration bar 60 may be formed for example from molybdenum in order to be able to withstand high temperatures (or may be formed from some other suitable material). The bar may be heated to a temperature which is above the melting temperature of tin (e.g., to above around 200° C., e.g. to above around 230° C.), such that residual tin droplets which are incident upon the obscuration bar remain in liquid form. A residual tin droplet which is incident upon the obscuration bar 60 may for example initially remain stationary on the obscuration bar. Over time, additional residual tin droplets may be incident at the same or adjacent locations on the obscuration bar, and these tin droplets may coalesce to form a larger droplet. Once the tin droplet grows to a particular size, gravity will cause the tin droplet to move downwards on the obscuration bar. The tin droplet will move downwards until it reaches a groove 66, whereupon further downward movement of the tin droplet will be prevented by that groove. If the grooves 66 were not present, then there would be a risk that the droplet would continue to flow downwards on the obscuration bar 60 and would fall from the edge 64 of the obscuration bar. This may be undesirable because it may lead to contamination of the collector optic CO, or other surfaces of the radiation source SO.

Referring to FIG. 3, in an embodiment the obscuration bar 60 may have a non-horizontal orientation. That is, in FIG. 3 the obscuration bar 60 may be oriented such that it is not parallel with the plane of the paper of FIG. 3 but instead is rotated about the optical axis O such that one end of the obscuration bar is raised above the plane of the paper and one end of the obscuration bar is below the plane of the paper. The obscuration bar 60 may thus be inclined relative to the horizontal. As a result of the non-horizontal orientation of the obscuration bar 60, liquid tin in the grooves 66 will flow along the grooves due to gravity, and will flow to a lowermost end of the obscuration bar. The liquid tin may then be received in a drain, gutter or some other suitable receptacle.

The grooves 66 may have any suitable cross-sectional shape. The grooves may for example be substantially v-shaped in cross-section (as illustrated in FIG. 14). The grooves may have a cross-sectional size and/or shape which gives rise to capillary action. The grooves may have a cross-sectional size and/or shape which gives rise to wicking action which draws liquid fuel into the grooves.

The obscuration bar 60 may include a heating system which is arranged to heat the obscuration bar to a temperature above the melting temperature of tin (e.g., to above around 200° C., e.g. to above around 230° C.). This may be considered to be an active heating system. Alternatively, the obscuration bar 60 may be heated by receiving heat from the plasma 14 and the laser beam emitted by the laser LA. This may be considered to be passive heating. The obscuration bar 60 may be heated by a combination of active and passive heating.

As will be appreciated from FIG. 14, a residual tin droplet which is incident upon a lowermost portion 68 of the obscuration bar 60 will not flow into a groove 66 because it is located beneath the lowermost grooves on the obscuration bar. In order to prevent liquid tin from dripping from the lowermost region 68 of the obscuration bar, this portion may be heated to a temperature which is above the evaporation temperature of tin. This temperature depends upon the pressure in the radiation source SO, and may for example be in the range 1100° C.-1600° C.

In an embodiment, heating of the lowermost portion 68 of the obscuration bar 60 to a temperature which causes evaporation may for example be achieved, at least in part, by arranging the width W of the connection between the lowermost portion 68 and the remainder of the obscuration bar 60 to be sufficiently narrow that transfer of heat away from the lowermost portion 68 to the remainder of the obscuration bar is limited. The lowermost portion 68 will be heated by laser radiation emitted by the laser LA (see FIGS. 3 and 4). Limiting the flow of heat from the lowermost portion 68 will limit the extent to which heat delivered to the lowermost portion by the laser radiation can be conducted away from the lowermost portion, thereby raising the temperature of the lowermost portion to a temperature which is significantly higher than the temperature of the remainder of the obscuration bar 60. The width W of the connection between the lowermost portion 68 and the remainder of the obscuration bar 60 may be selected such that the lowermost portion is heated to a temperature which is above the evaporation temperature of tin during operation of the radiation source.

The narrow connection between the lowermost portion 68 and the remainder of the obscuration bar is an example of thermal isolation of the lowermost portion. Other forms of thermal isolation may be used. For example, a material which is a poor thermal conductor may be used to connect the lowermost portion to the remainder of the obscuration bar, thereby limiting the transfer of heat. The term "thermal isolation" is not intended to mean that there is no transfer of heat between the lowermost portion and the remainder of the obscuration bar. Instead, "thermal isolation" may be interpreted as meaning that the transfer of heat is limited such that there may be a significant temperature difference between the lowermost portion and the remainder of the obscuration bar.

The grooves 66 may have a width which is comparable to the expected diameter of tin droplets which will be received in the grooves. The grooves 66 may for example have a width of a few millimeters (e.g., less than 10 mm).

The obscuration bar, which may be referred to simply as a bar, may have any suitable shape which allows grooves to be provided that direct the flow of liquid tin under the influence of gravity. The bar may for example have more than two faces.

An alternative approach to using grooves would be to maintain the entire obscuration bar 60 at a temperature which is above the evaporation temperature of tin. However, this may be undesirable because the evaporated tin could travel to and condense upon surfaces in the radiation source SO (or elsewhere), such as optical sources. Although in embodiments of the invention evaporation of tin takes place at the lowermost portion 68 of the obscuration bar, this is a relatively small proportion of the obscuration bar, and the amount of evaporated tin is thus relatively limited.

The obscuration bar 60 may incorporate one or more features of other embodiments of the invention.

One or more of the above embodiments may avoid the need to periodically interrupt operation of the radiation source SO to remove tin contamination. Alternatively, one or more of the above embodiments may increase the period between interruptions of operation of the radiation source SO to remove tin contamination.

Although in relation to one or more of the above embodiments reference has been made to liquid tin, the embodiments may also be applicable to other liquids. For example, in relation to the embodiments described in connection with FIGS. 11 to 13, if a liquid other than liquid tin is used to generate the EUV emitting plasma, that liquid may be used to maintain the wetting nature of the debris receiving surfaces.

The liquid fuel which is used to generate the EUV emitting plasma may be the same as the liquid fuel which is delivered onto the fuel debris receiving surface. Alternatively, fuel which is used to generate the EUV emitting plasma may be different from liquid fuel which is delivered onto the fuel debris receiving surface. Where a different liquid fuel is delivered to the fuel debris receiving surface, that fuel may be a fuel which provides a good wetting surface that promotes flow of liquid fuel debris. The liquid fuel may also be a fuel which reduces or avoids splashing of liquid fuel debris from the fuel debris receiving surface.

Different features of different embodiments of the invention may be combined together. For example, the vanes 42 shown in FIG. 12 may be used to direct the flow of tin without a liquid tin inlet 48 being present.

The laser LA may be separate from the radiation source SO, for example being provided at a different location (the laser beam may be guided into the radiation source using a beam guide). Where this is the case, the laser LA may be considered not to form part of the radiation source SO.

Although the collector optic CO shown in FIGS. 3 and 4 is a single curved mirror, the collector may take other forms. For example, the collector may be a Schwarzschild collector having two radiation collecting surfaces. In an embodiment, the collector may be a grazing incidence collector which comprises a plurality of substantially cylindrical reflectors nested within one another. The grazing incidence collector may be suited for use in a discharge produced plasma (DPP) source. Embodiments of the invention may comprise a DPP source.

In the above description the fuel which is emitted from the fuel droplet emitter 10 is tin. However, other fuels, such as for example xenon or lithium may be emitted from the fuel droplet emitter 10 (and/or may be used to provide a wetting surface on a fuel debris receiving surface).

The term "vane" may be interpreted as meaning a protuberance. The term "vane" may be interpreted as meaning a blade, a plate or other thin, flat or curved object attached (e.g., radially) to a surface that redirects the flow of a fluid, thereby providing directional control of drainage flow, and thus providing a fuel debris mitigation function (e.g., receives droplets of fuel and thereby reduces the likelihood of fuel droplets being incident upon optical surfaces).

A vane may be fixed to the surface or removable (i.e., extractable from a surface where it is fixed in order to allow it to be cleaned or replaced with a new vane).

The grooves may for example be formed by cutting into a surface (e.g., a smooth surface). Alternatively, the grooves may for example be formed by adding ribs or other structures to a surface such that grooves are established between the ribs or other structures.

FIG. 15 shows schematically viewed from above a portion of a liquid fuel debris guiding apparatus 102. The liquid fuel debris guiding apparatus 102 may, for example, be immobile. The liquid fuel debris guiding apparatus may, for example, be a wall or part of a wall of the radiation source SO, or may be some other part of the radiation source (or may be at some other location in the lithographic apparatus).

The liquid fuel debris guiding apparatus 102 comprises a plurality of electrodes 100. As depicted in FIG. 15, the electrodes 100 are physically separated from each other, the electrodes being arranged with gaps between them which define paths on a surface of the liquid fuel debris guiding apparatus 102. Potential differences between electrodes 100 may be set to guide liquid fuel debris 110 over the surface of liquid fuel debris guiding apparatus 102, along the paths defined by the gaps between electrodes 100.

FIG. 16 is a cross sectional view along line A-A of a portion of the liquid fuel debris guiding apparatus 102. The liquid fuel debris guiding apparatus 102 includes two layers of supporting material 101, which may for example be glass (or any other suitable material). The electrodes 100 are provided between the two layers of supporting material 101. The electrodes 100 may be formed from any conducting material. The electrodes may for example be layers of indium tin oxide and may for example be delivered onto a first layer of supporting material 101 by chemical vapour deposition. Gaps between the electrodes 100 may, for example, be created using an etching process. A layer of supporting material 101 may then be provided on top of the electrodes 100.

A layer of insulating material 103 is provided on top of the supporting material 101. The layer of insulating material 103 prevents current flowing between electrodes 100 and liquid fuel debris on the surface of the liquid fuel debris guiding apparatus 102 (which could occur if the supporting material 101 was not sufficiently insulative). The insulating material 101 may, for example, be polytetrafluoroethylene (PTFE-brand name TEFLON® by DuPont Co.). The supporting material 101 may itself be an insulating layer, in which case a separate insulating layer may not be required.

The electrodes 100 are each electrically connected to one terminal of voltage sources 105. The voltage sources 105 are connected at their other terminals to common reference voltages 106, which may for example be earth (as depicted in FIG. 16). The voltage sources 105 may provide an AC voltage. The voltage sources 105 may alternatively provide a DC voltage.

Liquid fuel debris guiding apparatus 102 may be tilted such that an upper end 107 of the liquid fuel debris guiding apparatus is elevated above a lower end 108 of the liquid fuel debris guiding apparatus. As a result, a droplet of liquid fuel debris 110 positioned on the surface of the liquid fuel debris guiding apparatus will move over the surface of the liquid fuel debris guiding apparatus 102, under the influence of gravity, in the direction depicted by arrow 109 in FIG. 15.

The voltage sources 105 may be set such that a potential difference exists between two electrodes. When a potential difference exists between electrodes, a potential well is formed in the proximity of the gap between electrodes. If a droplet of liquid fuel debris were to be located away from the gap between the electrodes, then the droplet of liquid fuel debris would experience no electric field. However, if the droplet of liquid fuel debris 110 were to overlap the gap between electrodes then it would experience an electric field (arising from the potential difference between the electrodes). When a droplet of liquid fuel debris experiences an electric field, electric field lines pass through the droplet of liquid fuel debris and the potential energy of the droplet of liquid fuel debris is reduced (compared with an identical droplet of liquid fuel debris which experiences no electric field). Referring to FIG. 15, paths on the surface of the liquid fuel debris guiding apparatus defined by gaps between electrodes 100a-e therefore represent positions at which the potential energy of a droplet of liquid fuel debris can be reduced by setting the voltages of electrodes 100a-e such that potential differences exist between them.

FIG. 17 shows schematically viewed from above the same portion of a liquid fuel debris guiding apparatus 102 that is depicted in FIG. 15. However, in FIG. 17, electrode 100b is supplied with a voltage of 400V and all other electrodes are connected to earth. A droplet of liquid fuel debris 110 positioned on the surface of liquid fuel debris guiding apparatus 102 in the vicinity of the gap between electrodes 100a and 100b will be held in the gap by the potential well established by the potential difference between the electrodes. The droplet of liquid fuel debris moves over the surface of the liquid fuel debris guiding apparatus, under the influence of gravity, in the direction depicted by arrow 109a. Because the potential difference between electrodes 100a and 100b reduces the potential energy of the droplet of liquid fuel debris 110, the droplet does not deviate to the left or right but is guided along the path defined by the gap between the electrodes.

The droplet of liquid fuel debris 110 travels in the direction indicated by arrow 109a until it arrives at the top of electrode 100d. The droplet is thus at a junction and can either move to the left or to the right. The droplet will move in the direction which minimises its potential energy. If the potential difference between electrodes 100*b* and 100*d* is sufficiently large that the potential energy of a droplet of liquid fuel debris positioned at the top of electrode 100*d* is minimised along the path defined by the gap between electrodes 100*b* and 100*d*, then the droplet of liquid fuel debris will follow the path defined by the gap between electrodes 100*b* and 100*d* (depicted by arrows 109*b* and 109*c*).

Similarly, if the potential difference between electrodes 100*b* and 100*e* is sufficiently large that the potential energy of a droplet of liquid fuel debris positioned at the top of electrode 100*e* is minimised along the path defined by the gap between electrodes 100*b* and 100*e*, then the droplet of liquid fuel debris will follow the path depicted by arrows 109*d* and 109*e*.

Alternatively, electrode 100*e* may be supplied with a voltage (for example 400V) such that the potential difference between electrodes 100*e* and 100*d* is sufficiently large that the potential energy of a droplet of liquid fuel debris positioned at the top of electrode 100*e* is minimised along the path defined by the gap between electrodes 100*e* and 100*d*. Accordingly, the droplet of liquid fuel debris will follow the path defined by the gap between electrodes 100*e* and 100*d*, as depicted by arrows 109*f* and 109*g*.

More generally, the voltages of any electrodes 100*a-e* may be set so as to create potential differences between electrodes such that liquid fuel debris follows any desired path, defined by gaps between electrodes, over the surface of the liquid fuel debris guiding apparatus.

The path of liquid fuel debris over the surface of a liquid fuel debris guiding apparatus 102 may be determined by setting potential differences between electrodes such that the potential energy of liquid fuel debris is minimised by following a desired path. The potential difference between electrodes, where the gap between electrodes defines a desired path of liquid fuel debris, may be set to any potential difference which is sufficient to minimise the potential energy of the liquid fuel debris along the path defined by the gap between electrodes. A sufficient potential difference may for example be 400V. Any other suitable potential difference may be used. The path defined by the gap between electrodes may be seen as an electrical equivalent of a groove as described above, wherein the flow is controlled, in addition to gravity, also by the electrical field created by the potential difference applied between the electrodes.

Voltage sources used to apply voltages to the electrodes may be controlled by a controller (not pictured). The controller may be any apparatus configured to selectively apply one or more voltages to electrodes, thereby establishing a potential difference between at least a first electrode and a second electrode. The controller may for example include a processor.

In general, any suitable voltage source may be used to apply a voltage to one or more electrodes.

In an embodiment, the voltages may be selectively applied to electrodes. That is, voltages may be applied to and disconnected from the electrodes, for example in order to select different paths along which the liquid fuel debris is guided. Alternatively, the voltages may be fixed, e.g. such that the same potential difference always exists between two electrodes when the fuel debris guiding apparatus is operational.

The liquid fuel debris may be liquid tin, or may be some other conducting liquid.

FIG. 18 shows schematically in cross section a fuel collector (80) according to an embodiment of the invention. The fuel collector 80 may for example correspond with the fuel tin collector 46 shown in FIG. 11. The fuel collector may be provided at any suitable location in the radiation source SO. The fuel collector may be positioned to receive liquid fuel (e.g. liquid fuel debris) from a gutter or from other sources.

The fuel collector comprises a receptacle 81 and a reservoir 82. Liquid fuel 79 is received in the reservoir 82 of the fuel collector. The reservoir 82 is provided with a hole 83 through which liquid fuel may drain from the reservoir into the receptacle. The liquid fuel 79 may be tin or may be some other fuel.

The receptacle is formed from a base 84 and walls 85. The receptacle 81 may for example be cylindrical, rectangular, or may have any suitable shape. The receptacle may for example have a diameter of around 100 mm. The reservoir 82 is located above the receptacle 81. The reservoir comprises a base 86 and walls 87. The reservoir may be cylindrical, rectangular, or may have any suitable shape. The reservoir 82 may be seated on top of the receptacle 81 (e.g. as shown). The reservoir 82 may be removable from the receptacle 81 in order to allow easy access to the receptacle. Alternatively, the reservoir 82 may be raised above the receptacle 81. The reservoir 82 may be heated in order to ensure that the fuel remains in liquid form whilst it is held in the reservoir. The receptacle 81 may be unheated, such that fuel will solidify in the receptacle.

A raised lip 88 extends around the hole 83. The raised lip 88 acts to prevent liquid fuel 79 from passing into the hole 83 until a level of the liquid fuel exceeds the height of the raised lip. The raised lip is formed from a non-wetting material (e.g. a material which provides a contact angle between the liquid fuel and the surface that is greater than 90°). The raised lip 88 may have a rounded upper surface (e.g. with a radius of curvature of 1 mm or more). The raised lip 88 may for example be formed from molybdenum.

Cohesive forces within the liquid fuel 79 will act to prevent the liquid fuel from flowing over the raised lip and into the hole 83 when the level of the liquid fuel only marginally exceeds the height of the raised lip (e.g. if the height is exceeded by around 1 mm).

The level of the liquid fuel 79 will continue to rise above the top of the raised lip 88 until such time that the cohesive forces within the liquid are not sufficient to prevent liquid fuel from flowing over the raised lip and into the hole 83 (e.g. when the level of the liquid fuel exceeds the liquid fuel's capillary height). When this occurs a substantial amount of liquid fuel will flow into the hole 83 and into the receptacle 81. The flow of liquid fuel into the hole 83 may be a continuous flow, and may be referred to as a single flow. The liquid fuel may flow into the hole 83 until the level of the liquid fuel is below the height of the raised lip 88.

The volume of liquid fuel which passes into the receptacle 81 during a single flow is significantly greater than the volume of liquid fuel that would enter the receptacle if the receptacle were to directly receive a droplet of liquid fuel from a gutter. Because the receptacle 81 is not heated, the liquid fuel will solidify in the receptacle 81. If the receptacle were to receive droplets of liquid fuel (e.g. from a gutter) then this would lead to the formation of a stalagmite extending upwardly from the base 84. Thus, the potential fuel storage capacity of the receptacle 81 would not be utilised, and the receptacle would need to be replaced frequently. When the embodiment of the invention is used, the amount of liquid fuel entering the receptacle 81 as a single flow is very much larger than a droplet, and the liquid fuel spreads out on the base 84 of the receptacle 81 before it solidifies. The fuel solidifies as a relatively flat body 78, which may resemble a pancake. In this way the volume of the receptacle 81 is more efficiently used, meaning that the intervals between replacing the receptacle are increased. This may advantageously increase the period of time for which the radiation source SO may be operated.

The height of the raised lip 88 may for example be equal to or greater than the capillary length of the liquid fuel (e.g. liquid tin). This is advantageous because it increases the amount of liquid fuel which will enter the receptacle 81 in a single flow (compared with the situation if the raised lip were to have a height significantly less than the capillary length of liquid fuel). The capillary length of liquid tin is 3 mm, and thus the height of the raised lip 88 may be 3 mm or more. In this context, the height of the raised lip 88 is as measured from the surface of the base 86 of the reservoir 82.

The walls 87 of the reservoir may for example have a height which exceeds the height of the raised lip 88 by at least the capillary length of the liquid fuel. This is because it is expected that the level of the liquid fuel 79 will not exceed the height of the raised lip 88 by more than a capillary length (flow of the liquid fuel into the hole 83 will occur when the liquid fuel reaches this height).

Although it may be possible to form the raised lip 88 without a rounded upper surface, doing so would tend to promote the flow of liquid fuel into the hole 83 when the level of the liquid fuel has reached a lower level (compared with the case when the raised lip has a rounded upper surface). This could occur for example due to a sharp edge of the lip causing ribbon of liquid fuel to flow across the raised lip. Consequently, the volume of liquid fuel entering the receptacle in a single flow would be reduced if the raised lip did not have a rounded upper surface.

Similarly, although the raised lip 88 may be made from a wetting material instead of a non-wetting material, this would cause the liquid fuel to flow more easily into the hole 83, thereby reducing the volume of liquid fuel entering the receptacle in a single flow.

Although molybdenum is mentioned as the material from which the raised lip 88 is formed, the raised lip may be formed from any suitable material. The material may for example be a non-wetting material.

In the illustrated embodiment, in addition to the raised lip 88 the hole 83 is also provided with a downwardly projecting lip 89. The downwardly projecting lip acts to prevent liquid fuel from flowing from the exit of the hole 83 onto a lower surface of the base 86. This would not be desirable because the liquid fuel could remain on the base 86 for some time and then subsequently drip into the receptacle 81, thereby leading to the formation of stalagmite.

The downwardly projecting lip 89 has a sharp edge, which inhibits the flow of liquid fuel around the downwardly projecting lip and onto the bottom of the base 86. The downwardly projecting lip 89 may for example extend by 2 mm or more beyond the bottom surface of the base 86.

The downwardly projecting lip 89 may be formed from any suitable material.

The downwardly projecting lip 89 may be formed from a non-wetting material. The downwardly projecting lip 89 may be formed from molybdenum.

The downwardly projecting lip 89 and the raised lip 88 may be formed from a single piece of material (e.g. formed as tube), which may be fitted to the base 86. An outer surface of the tube may include a step, thereby allowing the tube to be pushed into the hole 83 and securely retained therein.

The hole 83 may for example have a diameter of 8 mm or more. Forming the hole 83 with a diameter of 8 mm or more may reduce the likelihood of the hole becoming clogged (compared with a hole with a narrower diameter). The hole may for example have a diameter of up to 12 mm.

The hole 83 may for example be circular or elliptical in shape. The hole 83 may have any suitable shape.

FIG. 19 shows schematically viewed from one side in partial cross-section a radiation source housing apparatus 141 according to an embodiment of the invention. The radiation source housing apparatus 141 comprises a rotatably mounted housing 140. The illustrated housing 140 is substantially conical, although it may have any suitable shape. A plurality of vanes 142 extend inwardly from the housing 140. The vanes 142 may be distributed around the housing 140. Although seven vanes are shown in FIG. 19, this is merely a schematic illustration, and any suitable number of vanes may be provided. For example, twenty or more vanes, forty or more vanes or sixty or more vanes may extend inwardly from the housing 140. A fuel debris collector 146 is located beneath a lowermost portion of the housing 140.

The radiation source housing apparatus further comprises a heater 150 provided on one side of the housing 140. The heater 150 is arranged to heat a portion of the housing which is in the vicinity of the heater to a temperature which is above the melting temperature of tin. For example, the heater 150 may be arranged to hold the temperature of the portion of the housing 140 in the vicinity of the heater to a temperature above around 230° C., e.g. above around 250° C.

The radiation source housing apparatus further comprises a cooler 152. The cooler 152 is shown in FIG. 19 as being on an opposite side of the housing 140 from the heater 150. The cooler 152 may be arranged to cool a portion of the housing 140 in the vicinity of the cooler such that that portion of the housing has a temperature which is below the melting point of tin. For example, the cooler 152 may keep the temperature of the portion of the housing 140 in the vicinity of the cooler below around 230° C. (e.g. below around 200° C.).

The radiation source housing apparatus further comprises an actuator 154 connected to the housing 140. The actuator causes the housing 140 to rotate. The housing 140 may for example be mounted such that it rotates about the optical axis OA of the radiation source. The rotation may for example be at a speed of around one rotation per hour (or may be at any other suitable speed). The rotation may be continuous or may be intermittent. For example, in an embodiment the housing 140 may rotate 30° after 10 minutes has elapsed, rotate another 30° after another 10 minutes has elapsed, etc. In this embodiment, a full rotation of the housing 140 will take place in two hours. Any suitable amounts of rotation and intervals may be used.

The actuator 154 may for example be a motor, or may for example comprise a connection to a remotely located motor. The rotatable mounting of the housing 140 may take any suitable form, and for simplicity is not shown here. If the rotatable mounting is located in a part of a radiation source which is at vacuum, then a vacuum compatible rotatable mounting may be used.

The radiation source housing apparatus 141 forms part of a radiation source. Other parts of the radiation source are not shown, but may for example correspond with parts of the radiation source SO shown in FIGS. 3 and 4. The radiation source may use tin, or any other suitable fuel. In this description tin is referred to, but embodiments of the invention may be adapted for any suitable fuel.

FIG. 20 shows schematically the housing 140 in cross-section along line B-B. The vanes 142 may be seen extending inwardly from the housing 140, the vanes having been represented schematically with triangular cross-sectional shapes. Although twelve vanes are shown, any suitable number of vanes may be provided. The vanes may for example be arranged such that there is little or no spacing between them. The heater 150 is schematically represented as being rectangular in cross-section, but may have any suitable shape. As may be seen from FIG. 20, the cooler 152 extends around more than three quarters of the circumference of the housing. The cooler 152 is configured such that the cooler cools the majority of the housing 140. The heater 150 extends around less than one quarter of the circumference of the housing 140. The heater 150 is configured such that the heater heats less than one quarter of the circumference of the housing 140.

Rotation of the housing caused by the actuator 154 (see FIG. 19) is represented schematically by an arrow in FIG. 20. The housing may rotate in the opposite direction to that shown.

Operation of the apparatus shown in FIGS. 19 and 20 is as follows. The cooler 152 cools the portion of the housing 140 around which it extends to a temperature which is below the melting temperature of tin. When tin debris is incident upon the cooled portion of the housing 140 it therefore solidifies. This is advantageous because it reduces the likelihood of tin dripping from the housing 140 and on to optical components of the radiation source such as the collector optic CO (see FIGS. 3 and 4).

Tin debris which is incident upon the cooled portion of the housing 140 will remain in a solid state because it is below the melting temperature of tin. This will remain the case until the rotation of the housing 140 caused by the actuator 154 brings the debris bearing portion of the housing into the vicinity of the heater 150. The heater 150 raises the temperature of the portion of the housing adjacent the heater until that portion of the housing 140 is above the melting temperature of tin. The tin debris thus melts and becomes liquid as it approaches the heater 150. Once the tin debris has become liquid, it flows down the housing 140 under the influence of gravity, and is received in the tin collector 146.

The housing 140 continues to turn due to the actuator 154. The heated portion of the housing 140 will, as it moves away from the heater 150, cool to a temperature which is below the melting temperature of tin (thus becoming a cooled portion of the housing). Once this has happened, any tin debris which is incident upon that portion of the housing will solidify and will therefore not drip onto the collector or other optical surfaces.

As will be understood from the above, a first portion of the housing 140 is heated by the heater 150 and a second different portion of the housing is cooled by the cooler 152. Due to rotation of the housing 140 the heated portion will move from being adjacent to the heater 150 to being adjacent to the cooler 152, and the heated portion will therefore become a cooled portion. Similarly, due to the rotation of the housing 140 part of the cooled portion will move from being adjacent to the cooler 152 to being adjacent to the heater 150, and that part of the cooled portion will therefore become a heated portion.

As may be seen from FIGS. 19 and 20, the heater 150 is positioned adjacent to a portion of the housing 140 which does not have a downwardly facing inner surface. The heater 150 is positioned adjacent to a portion of the housing 140 where vanes 142 do not include downwardly facing surfaces. The heater 150 may be described as being positioned adjacent to a lowermost side of the housing 140.

As a result of the positioning of the heater 150, there is no possibility of tin which is melted by the heater dripping off a downwardly facing surface in an unwanted manner (e.g. onto the collector optic CO or some other optical surface). Instead, the liquid tin is constrained to flow downwards under the influence of gravity along an upwardly facing inner surface of the housing 140 (e.g. including upwardly facing vanes 142). The liquid tin flows downwards along the upwardly facing portion of the housing 140 until it reaches a bottom end of the housing, from where it drips into the tin collector 146. In this context the term "upwardly facing" is not intended to be limited to a surface which faces vertically upwards, but is instead intended to encompass a surface which faces in a direction that includes a vertically upward component. Similarly, in this context the term "downwardly facing" is not intended to be limited to a surface which faces vertically downwards, but is instead intended to encompass a surface which faces in a direction that includes a vertically downward component.

In an embodiment, the portion of the housing 140 adjacent to the heater 150 does not have an inner surface from within which liquid tin can drip. In other words, there is no location within that portion of the inner surface at which liquid tin may accumulate and form into a droplet which falls from the inner surface. Liquid tin may accumulate and form into a droplet at a lowermost edge of the portion of the inner surface (falling from there into the tin collector 146). However, dripping of liquid tin in this manner is from the lowermost edge of the inner surface and is therefore not from within the inner surface.

In an embodiment, the heater is arranged to heat the first portion of the rotatably mounted housing to a temperature at which tin (or other fuel) on the housing will be in a liquid state. In an embodiment, the cooler is arranged to cool the second portion of the rotatably mounted housing to a temperature at which tin (or other fuel) on the housing will be in a solid state.

The term "solid state" may be considered to encompass a state such as a gel-like state where the tin (or other fuel) cannot flow or drip but has some malleability.

The vanes 142 may provide some guidance of the flow of liquid tin. This guidance of the flow of the liquid tin by the vanes may not be necessary, since the position of the heater 150 is such that flow caused by gravity will be in a desired direction (e.g. towards the tin collector 146). The vanes 142 may however provide other useful functionality, such as reducing the likelihood of incident tin debris scattering from the housing 140 towards a collector optic CO or other optical surface.

Grooves may be provided in the vanes 142 and/or in portions of the housing 140 between vanes. The grooves may not be needed to guide the liquid tin in particular desired directions. However, the grooves may nevertheless provide a degree of guidance.

An advantage of the embodiment of the invention is that it reduces or eliminates dripping of liquid tin onto the collector optic CO or other optical surfaces of the radiation source SO. Another advantage is that the apparatus is cooler than would be the case if the entire housing were to be heated (which may for example be necessary for other embodiments). This may be useful for example if it is desired to perform maintenance or repair work upon the radiation source, because the radiation source will more rapidly cool to a temperature which is sufficiently low to allow the apparatus to be safely accessed.

The heater 150 may for example extend around approximately one-tenth or less of the circumference of the housing 140. The heater 150 may for example extend around up to one-sixth of the circumference of the housing 140. The heater 150 may for example extend around less than one-third of the circumference of the housing 140. The extent to which the heater 150 extends around the circumference of the housing 140 will at least partially depend upon thermal properties of the housing (e.g. the extent to which heat that is delivered to the housing is conducted around the housing). The heater may extend sufficiently far around the circumference that tin debris is heated for a sufficiently long time that it becomes liquid and is able to flow into the tin collector 146 (e.g. rather than solidifying again before it reaches the tin collector). This may depend at least partially upon the size of tin debris particles which are expected to be received on the housing (a larger tin debris particle will require more heat before it melts).

In an embodiment, the heater does not extend so far around the housing circumference that it keeps the tin in liquid form after the housing has rotated to a point at which liquid tin could drip from the housing onto an unwanted location (e.g. onto the collector optic CO). For example, the heater 150 may provide sufficient heat to keep tin in liquid form around less than one-third of the circumference of the housing 140, less than one-sixth of the circumference of the housing, or around one-tenth or less of the circumference of the housing.

The cooler 152 may for example extend around at least two thirds of the circumference of the housing 140. The cooler 152 may for example extend around up to five sixths of the circumference of the housing 140. The cooler 152 may for example extend around up to nine tenths of the circumference of the housing 140.

The housing may for example be formed from steel or molybdenum, or any other suitable material. The term "formed from" is not intended to mean that all other materials are excluded; the housing may include other materials. Where steel is used, the steel may for example be coated with tin. This may for example promote sticking of the tin debris to the housing. Similarly, molybdenum may be provided with a tin coating.

The thermal properties of steel are such that although some heat will be conducted from the heater 150 around the housing 140, the conducted heat will be relatively limited. Thus, an elevated housing temperature caused by the heater 150 may be primarily in the vicinity of the heater. Although the thermal conductivity of molybdenum is greater than that of steel, in an embodiment in which molybdenum is used, the elevated housing temperature may still be generally restricted to the vicinity of the heater 150.

The thickness of the housing 140 may be chosen taking into account thermal properties of the housing. A thinner housing will provide less heat conduction than a thicker housing (for a given temperature in the vicinity of the heater).

In the above described embodiment, the heater 150 and cooler 152 act on only part of the housing 140 (the illustrated rotationally mounted housing). The radiation source housing may however include other portions, for example other walls as shown in FIGS. 3 and 4. In an embodiment, one or more of these other portions may also be heated and cooled using appropriately positioned heaters and coolers, and these portions may also be driven to rotate (e.g. using an actuator). In an embodiment, the entire housing may be driven to rotate (and may be heated and cooled accordingly). Where this is the case, the rotatable mounting may be located outside of the part of the radiation source which is at vacuum, and a rotatable mounting which is not vacuum compatible may be used.

In FIG. 20 the heater 150 is centred at the lowermost point of the circumference of the housing 140. However, in an embodiment, the heater 150 may be partially offset, for example extending further in an upstream direction from the lowermost point and extending less far in a downstream direction from the lowermost point (the term "upstream" is intended to mean in a direction opposite to the direction of movement of the housing). This is illustrated schematically by dashed line 150a. Where this is arrangement is used, heating of solid tin debris may begin earlier and may cease earlier. This may increase the likelihood of tin debris having melted to liquid form when that tin debris is at the lowermost point of the circumference of the housing 140. It may reduce the likelihood of tin debris being in liquid form when it has moved a significant distance away from the lowermost point of the circumference of the housing 140.

FIG. 21 shows schematically in cross section a fuel collector 90 according to an embodiment of the invention. The fuel collector 90 may for example correspond with the tin collector 46 shown in FIG. 11 or the tin collector 146 shown in FIG. 19. The fuel collector may be provided at any suitable location in the radiation source SO. In use, the fuel collector 90 is positioned to receive liquid fuel (e.g. liquid fuel debris such as tin) from a fuel source 91 (e.g. a drain or gutter which forms part of an EUV radiation source).

The fuel collector comprises a receptacle 92. The receptacle 92 is formed from a base 92a and one or more walls 92b and is provided with an open end 93 and a closed end 94. In the illustrated embodiment, the receptacle 92 is generally cylindrical in shape, however, the receptacle may have any suitable shape.

In use, the receptacle is orientated with the open end 93 generally above the closed end 94. As shown, the receptacle 92 may be orientated at an angle. However, the receptacle 92 may alternatively be disposed so that the base 92a is substantially horizontal. The open end 93 provides an entrance through which liquid fuel may enter the receptacle 92. The closed end 94 provides a storage portion of the receptacle.

In use, the receptacle is disposed generally below a liquid fuel source 91. The liquid fuel may be tin or may be some other fuel. Fuel may fall under gravity from the fuel source 91 in the direction indicated by arrow 95 into the receptacle 92 via the open end 93.

The receptacle further comprises a shelf 96. The shelf 96 is disposed within the receptacle 92 such that fuel falling from the fuel source 91 is incident upon an upper surface 96a of the shelf. Substantially all fuel falling from the fuel source 91 may be incident upon the upper surface 96a of the shelf.

The shelf 96 comprises a cantilever structure with one end of the shelf 96 being supported by a wall 92b of the receptacle 92, the shelf 96 extending inwards from said wall 92b.

The shelf 96 is not heated. Therefore the temperature of the shelf 96 will generally be below the melting point of the fuel, which may, for example, be tin. As a result, as fuel drips onto the shelf 96, it will solidify and adhere to the upper surface 96a, forming a pancake of fuel. In this context the term "pancake" may be considered to mean having a form which visually resembles a pancake.

The shelf 96 may be formed from a non-wetting material. In particular, the shelf may be formed from a material which is low wetting with respect to a fuel it is desired to collect.

Advantageously, this prevents the fuel from adhering strongly to the shelf and makes it easier for solidified fuel to be removed from the surface of the shelf. In one embodiment of the invention, the fuel collector 90 is particularly suitable for the collection of tin and the shelf 96 is formed from molybdenum. Molybdenum is chosen for the shelf 96 since it is low wetting with respect to tin (i.e. providing low adhesion forces between the shelf and the tin).

When no fuel is on the shelf 96 it is generally disposed in a first position (as indicated by the solid line in FIG. 21). The first position is such that, in use, the upper surface 96a of the shelf 96 is generally horizontal.

The shelf is arranged so that as fuel builds up on the shelf, the weight of the fuel will cause the shelf 96 to rotate so that the angle of inclination of the upper surface 96a will increase (relative to horizontal). Because the shelf is inclined relative to the horizontal there will be a component of the weight of the pancake of solid fuel which acts along the upper surface, tending to pull the pancake of fuel downwards and towards a distal end 96b of the shelf. This is resisted by the adhesive force between the fuel and the upper surface 96a of the shelf. At some point, the shelf will reach a second position (as indicated by the dotted line in FIG. 21) wherein the component of the weight of the pancake of fuel is sufficient to overcome the adhesive forces and the pancake will fall off shelf and into the storage portion.

Movement of the shelf 96 between the first and second positions therefore provides a mechanism for transferring fuel from the upper surface 96a to the storage portion.

As will be appreciated by the skilled person, some other mechanism for transferring a pancake of fuel from the upper surface 96a to the storage portion may be provided. For example, the shelf 96 may be substantially fixed relative to the receptacle 92 and may be provided with a member that is operable to sweep across the shelf 96 and push the pancake of fuel off the shelf and into the storage portion.

The shelf 96 may be arranged to move between the first and second positions in any suitable way. For example, the shelf may be rotatably connected to the wall 92b of the receptacle 92, facilitating rotation between the first and second positions. Additionally or alternatively, the shelf 96 may be formed from an elastic material which will deform under the weight of incident fuel.

The shelf 96 is provided with a resilient bias, which biases it towards the first position. The resilient bias may comprise a spring. In one embodiment, the shelf 96 is formed from an elastic material and comprises a leaf spring.

The resilient bias resists movement from the first position to the second position. Once the shelf 96 has reached the second position and pancake of fuel slides off the shelf 96 and into the storage portion, the resilient bias causes the shelf 96 to move back to the first position. The resilient bias may be tuned so as to alter the size of pancakes of fuel that are created. For example, the stiffness of the shelf 96 may be tuned to achieve the desired size of fuel pancakes so as to ensure an acceptable level of filling. This may be achieved by choosing the thickness of the shelf: a relatively thin shelf 96 will be less stiff and therefore may create a relatively small and thin pancake whereas a thicker shelf 96 will be stiffer and may create a larger, heavier pancake.

The shelf 96 may for example comprise a Molybdenum plate which is around 0.1 mm thick.

A fuel collector 90 of the type shown in FIG. 21 allows quantities of fuel to be deposited in the storage portion periodically. Advantageously, this can prevent the formation of a single stalagmite in the receptacle 92, and thereby lead to an improvement in the filling rate of receptacle 92 (i.e. increase the time which elapses before the fuel collector is full). In turn, this has a significant impact on the availability of an EUV radiation source, since it may not be possible to operate the EUV radiation source whilst the fuel collector 90 is being emptied.

The production of fuel, such as tin, from the fuel source 91 may be low. As such, the fuel may fall into the receptacle as individual drops. For example, 0.3 ml drops may fall from the fuel source at a rate of around 3 drops per hour (although other amounts of fuel may fall into the receptacle). This is equivalent to around 150 ml of fuel per week. Since the temperature of the collector 90 is generally below the melting point of the fuel, drops of fuel will solidify on top of each other within the receptacle. Therefore, without the shelf 96, a stalactite may be formed with a rather small diameter. As a consequence, fuel would reach the top of the receptacle 92 after the supply of a relatively small quantity of fuel, requiring the receptacle 92 to be emptied. Thus, the potential fuel storage capacity of the receptacle 92 would not be utilized, and the receptacle 92 would need to be emptied or replaced frequently.

When the embodiment of the invention is used, the shelf 96 prevents a single fuel stalagmite from forming. Rather, small quantities of solid fuel are formed on the shelf 96 (e.g. in the form of pancakes), which are subsequently transferred to a lower storage portion of the receptacle. In this way the volume of the receptacle 92 is more efficiently used, meaning that the intervals between replacing or emptying the receptacle are increased. This may advantageously increase the period of time for which the radiation source SO may be operated.

In the above described embodiment of the invention, the shelf 96 is an object that is disposed within the receptacle 92 such that fuel passing through the entrance 93 is incident upon a surface 96a of the shelf 96. Movement of the shelf 96 between the first and second positions provides a mechanism for transferring fuel from the upper surface 96a to the storage portion. However, other objects may alternatively be used. For example, the object may comprise a wheel with a curved outer surface. The wheel may be disposed in such a way that fuel passing through the entrance 93 is incident upon its curved surface in such a way that solid fuel adhered thereto will cause the wheel to rotate about its axis. As the wheel rotates, more fuel may be deposited onto the curved surface at different circumferential positions. As the wheel rotates, deposits of solid fuel on a lower portion of the wheel may fall off into the storage portion.

FIG. 22 shows schematically in cross section a fuel collector 100 according to an embodiment of the invention. The fuel collector 100 may for example correspond with the tin collector 46 shown in FIG. 11 or the tin collector 146 shown in FIG. 19. The fuel collector may be provided at any suitable location in the radiation source SO. In use, the fuel collector 100 is positioned to receive liquid fuel (e.g. liquid fuel debris) from a fuel source 101.

The fuel collector comprises a receptacle 102. The receptacle 102 is formed from one or more walls 102a and is provided with a first end 103 and a second end 104. In use the first end 103 end forms an entrance through which liquid fuel may enter the receptacle 102 and is orientated generally above the second end 104. In use, the second end 104 forms an exit through which fuel may be removed from the receptacle 104. In the illustrated embodiment, the receptacle 102 is generally cylindrical in shape, however, the receptacle may have any suitable shape. A portion of the wall of the receptacle 102 comprises a surface 102b which is arranged to form a slide (the wall portion is generally upward facing and inclined relative to the horizontal). The second end 104 is disposed at a lower end of the slide.

In use, the receptacle 102 is disposed generally below a liquid fuel source 101. The liquid fuel may be tin or may be some other fuel. Fuel may fall under gravity from the fuel source 101 in the direction indicated by arrow 105 into the receptacle 102 via the open end 103. Such liquid fuel is incident upon the receptacle wall surface 102b which is arranged to form a slide.

The receptacle wall surface 102b is formed from a material which is low wetting with respect to a fuel it is desired to collect. Advantageously, this prevents the fuel from adhering strongly to this surface 102b. In one embodiment of the invention, the fuel collector 100 is particularly suitable for the collection of tin and surface 102b is formed from molybdenum. Molybdenum is chosen since it is low wetting with respect to tin (providing low adhesion forces between the surface 102b and the tin).

The fuel collector 100 may be unheated. The temperature of at least the surface 102b upon which liquid fuel is incident is below the melting point of a fuel it is desired to collect. Therefore, as the liquid fuel is incident upon the surface 102b, it will solidify and adhere weakly thereto.

Such a fuel collector 100 allows quantities of fuel to be deposited in the storage portion periodically. When liquid fuel is incident upon the surface 102b, it will solidify and will only weakly adhere to the surface. Since the surface 102b is inclined and arranged to form a slide, once a sufficient quantity of solid fuel builds up it will slide down the surface 102b due to gravity. That is, the weight of the quantity of solid fuel overcomes adhesion forces between the surface of the surface 102b and the solid fuel, causing the solid fuel to slide down the surface. Thus, fuel does not adhere to the receptacle, thereby allowing the receptacle to be more easily emptied.

The fuel collector 100 further comprises two vacuum valves 106, 107. A first valve 106 is disposed towards the first end 103 of the receptacle 102. A second valve 107 is disposed towards the second end 104 of the receptacle 102 and is operable to seal the exit of the receptacle 102.

During normal operation of the EUV radiation source the first valve 106 is open, allowing fuel to enter the receptacle, and the second valve 107 is closed, so that the receptacle 102 may be maintained at substantially the same pressure as the EUV radiation source (not shown).

The first and second valves 106, 107 form an air lock. Accordingly, in order for fuel to be removed from the receptacle 102, the first valve 106 is closed to isolate the air lock portion of the receptacle 102 from the EUV radiation source. Once the first valve 106 is closed, the second valve 107 is opened so as to allow fuel to be removed from the receptacle. The surface 102b upon which liquid fuel is incident is inclined, is not heated and is formed from a material which is low wetting with respect to a fuel it is desired to collect (such as, for example, tin). Thus, slices of solid fuel are formed which do not adhere strongly to the receptacle 102. Once they are sufficiently large, they will fall under gravity down the surface 102b towards the exit. When the exit has been opened using valves 106, 107 the slices of solid fuel will fall out of the receptacle.

In order for normal operation to resume, the second valve 107 is closed. Once the second valve 107 is closed, the air lock is pumped down to form a vacuum. The first valve 106 is then opened and normal operation of the fuel collector 100 may resume.

Although the air lock formed by valves 106, 107 is described in relation to the fuel collector shown in FIG. 22, the air lock may be used with any other suitable fuel collector (e.g. the fuel collector shown in FIG. 21).

Although above embodiments of the invention have been described in the context of tin, the embodiments may be used for any suitable fuel.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and clauses and their equivalents.

Clauses

1. A radiation source comprising a fuel source configured to deliver fuel to a location from which the fuel emits EUV radiation, wherein the radiation source further comprises an immobile fuel debris receiving surface provided with a plurality of grooves, the grooves having orientations which are arranged to direct the flow of liquid fuel under the influence of gravity in one or more desired directions.

2. The radiation source of clause 1, wherein the fuel debris receiving surface is provided with a plurality of vanes, and the plurality of grooves are provided in the vanes.

3. The radiation source of clause 1, wherein at least some of the grooves have a cross-sectional size and/or shape which gives rise to capillary action.

4. The radiation source of clause 1, wherein at least some of the grooves have a cross-sectional size and/or shape which gives rise to wicking action which draws liquid fuel into the grooves.

5. The radiation source of clause 1, wherein one or more of the grooves include a corner which extends longitudinally along the groove.

6. The radiation source of clause 1, wherein one or more of the grooves is v-shaped in cross-section.

7. The radiation source of clause 6, wherein the v-shaped groove has an opening angle which is between around 30° and 50°.

8. The radiation source of clause 1, wherein the grooves comprise a set of grooves which extend substantially parallel to one another.

9. The radiation source of clause 1, wherein at least some of the grooves have a depth of 0.1 mm or more.

10. The radiation source of clause 1, wherein at least some of the grooves have a depth of 2 mm or less.

11. The radiation source of clause 1, wherein the at least some of the grooves have a width of 0.1 mm or more.

12. The radiation source of clause 1, wherein at least some of the grooves have a width of 10 mm or less.

13. The radiation source of clause 1, wherein adjacent grooves are separated by a distance which is equal to or less than twice the capillary length of the liquid fuel.

14. The radiation source of clause 2, wherein the vanes are distributed around a housing of the radiation source.

15. The radiation source of clause 2, wherein the vanes are reflective structures located in the vicinity of an intermediate focus of the radiation source.

16. The radiation source of clause 2, wherein the vanes are located in a fuel catcher of the radiation source.

17. The radiation source of clause 1, wherein the grooves have orientations which are arranged to direct the flow of liquid fuel under the influence of gravity to a drain or a gutter.

18. The radiation source of clause 17, wherein the grooves are connected to the drain or gutter.

19. The radiation source of clause 1, wherein the vanes are heated by a heating apparatus to a temperature which is above the melting temperature of the fuel and which is below the evaporation temperature of the fuel.

20. The radiation source of clause 1, wherein the immobile fuel debris receiving surface is a bar which extends across an interior of the radiation source and thereby obscures radiation.

21. The radiation source of clause 20, wherein the bar has a non-horizontal orientation.

22. The radiation source of clause 20, wherein the bar includes a lowermost portion which is thermally isolated from the remainder of the bar such that transfer of heat from the lowermost portion to the remainder of the bar is limited.

23. The radiation source of clause 22, wherein the thermal isolation is provided by a narrow connection between the lowermost portion and the remainder of the bar.

24. The radiation source of clause 22, wherein the thermal isolation is such that in use the lowermost portion of the bar is heated to a temperature which is above the evaporation temperature of the fuel.

25. An apparatus comprising the radiation source comprising a fuel source configured to deliver fuel to a location from which the fuel emits EUV radiation, wherein the radiation source further comprises an immobile fuel debris receiving surface provided with a plurality of grooves, the grooves having orientations which are arranged to direct the flow of liquid fuel under the influence of gravity in one or more desired directions.

26. A method of generating EUV radiation using a radiation source, the method comprising:
delivering fuel to a location at which a plasma which emits EUV radiation is generated using the fuel; and
receiving liquid fuel on an immobile surface of the radiation source, and wherein grooves provided in the immobile surface direct the flow of liquid fuel under the influence of gravity in one or more desired directions.

27. A radiation source comprising a fuel source configured to deliver fuel to a location from which the fuel emits EUV radiation, wherein the radiation source further comprises a fuel debris receiving surface and a liquid fuel inlet configured to deliver a flow of liquid fuel onto the fuel debris receiving surface.

28. The radiation source of clause 27, wherein the liquid fuel inlet is connected to the fuel debris receiving surface.

29. The radiation source of clause 27, wherein the liquid fuel inlet is configured to provide a coating of liquid fuel on the fuel debris receiving surface.

30. The radiation source of clauses 27, wherein the fuel debris receiving surface comprises a plurality of vanes.

31. The radiation source of clause 30, wherein spaces between the vanes are grooves which direct the flow of liquid fuel under the influence of gravity in one or more desired directions.

32. The radiation source of clause 30, wherein the liquid fuel inlet comprises openings located between the vanes or adjacent to the vanes.

33. The radiation source of clause 30, wherein the liquid fuel inlet is configured to deliver liquid fuel at a rate that fills an area at the base of the vanes to a desired fill level.

34. The radiation source of clause 30, wherein the vanes are shaped to generate capillary pressure which draws liquid fuel away from tips of the vanes.

35. The radiation source of clause 27, wherein the liquid fuel inlet comprises a plurality of openings connected to a conduit.

36. The radiation source of clause 27, wherein the radiation source further comprises a heater configured to heat the fuel debris receiving surface to a temperature which is above the melting temperature of the fuel.

37. A method of controlling contamination in a radiation source which uses fuel to generate EUV radiation, the method comprising:
delivering liquid fuel via an inlet onto a fuel debris receiving surface such that a coating of liquid fuel is maintained on the fuel debris receiving surface.

38. An apparatus comprising the radiation source comprising a fuel source configured to deliver fuel to a location from which the fuel emits EUV radiation, wherein the radiation source further comprises a fuel debris receiving surface and a liquid fuel inlet configured to deliver a flow of liquid fuel onto the fuel debris receiving surface.

39. A method of generating EUV radiation using a radiation source, the method comprising:
delivering fuel to a location at which a plasma which emits EUV radiation is generated using the fuel;
receiving liquid fuel on an immobile surface of the radiation source, and using grooves provided in the immobile surface to direct the flow of liquid fuel under the influence of gravity in one or more desired directions.

40. A radiation source comprising:
a fuel source configured to deliver fuel to a location from which the fuel emits EUV radiation, and
a fuel debris receiving surface and a liquid inlet configured to deliver a flow of liquid alloy or metal onto the fuel debris receiving surface.

41. The radiation source of clause 40, wherein the liquid inlet is connected to the fuel debris receiving surface.

42. The radiation source of clause 40, wherein the liquid fuel inlet is configured to provide a coating of liquid alloy or metal on the fuel debris receiving surface.

43. The radiation source of clause 40, wherein the fuel debris receiving surface comprises a plurality of vanes.

44. The radiation source of clause 43, wherein spaces between the vanes are grooves which direct the flow of liquid alloy or metal under the influence of gravity in one or more desired directions.

45. The radiation source of clause 43, wherein the liquid inlet comprises openings located between the vanes or adjacent to the vanes.

46. The radiation source of clause 43, wherein the liquid inlet is configured to deliver liquid alloy or metal at a rate that fills an area at the base of the vanes to a desired fill level.

47. The radiation source of clause 43, wherein the vanes are shaped to generate capillary pressure which draws liquid alloy or metal away from tips of the vanes.

48. The radiation source of clause 40, wherein the liquid inlet comprises a plurality of openings connected to a conduit.

49. The radiation source of clause 40, wherein the liquid alloy or metal is liquid fuel.

50. The radiation source of clause 49, wherein the radiation source further comprises a heater configured to heat the fuel debris receiving surface to a temperature which is above the melting temperature of the fuel.

51. The radiation source of clause 40, wherein the liquid inlet comprises a porous metal through which the metal or alloy is delivered.

52. The radiation source of clause 40, wherein the liquid inlet is configured to deliver a metal or alloy which is liquid at room temperature onto the fuel debris receiving surface.

53. The radiation source of clause 52, wherein the metal or alloy is Galinstan.

54. The radiation source of clause 52, wherein the radiation source further comprises a cooling apparatus configured to cool a housing of the radiation source.

55. The radiation source of clause 54, wherein the cooling apparatus is configured to cool the housing of the radiation source to around room temperature.

56. A method of controlling contamination in a radiation source which uses fuel to generate EUV radiation, the method comprising:
delivering liquid alloy or metal via an inlet onto a fuel debris receiving surface such that a coating of liquid alloy or metal is maintained on the fuel debris receiving surface.

57. The method of clause 56, wherein the alloy or metal is delivered continuously via the inlet.

58. The method of clause 56, wherein the alloy or metal is delivered intermittently via the inlet.

59. The method of clause 56, wherein the inlet comprises a porous metal through which the metal or alloy is delivered.

60. The method of clause 56, wherein the metal or alloy is liquid fuel.

61. The method of clause 56, wherein the metal or alloy is liquid at room temperature.

62. The method of clause 61, wherein the metal or alloy is Galinstan.

63. The method of clause 61, wherein the method further comprises cooling a housing of the radiation source to room temperature.

64. A liquid fuel debris guiding apparatus comprising:
a surface;
two electrodes separated from the surface by an insulating layer, a gap being provided between the two electrodes that defines a path on the surface; and
a voltage source configured to apply a voltage to one of the electrodes, thereby establishing a potential difference across the gap between the electrodes, the potential difference acting to guide liquid fuel droplets along the path defined by the gap.

65. The liquid fuel debris guiding apparatus of clause 64, wherein the apparatus further comprises one or more additional electrodes connected to one or more voltage sources, gaps being provided between the electrodes which define paths on the surface.

66. A method of directing a flow of liquid fuel debris, the method comprising:
applying a voltage to one of two electrodes which are separated from the surface by an insulating layer, a gap being provided between the two electrodes which defines a path on the surface, the voltage establishing a potential difference across the gap between the electrodes that acts to guide liquid fuel droplets along the path defined by the gap.

67. A fuel collector for an EUV radiation source, the fuel collector comprising:
a receptacle; and
a reservoir, the reservoir being located above the receptacle, and
wherein the reservoir is provided with a hole through which liquid fuel may drain from the reservoir into the receptacle, and wherein a raised lip extends around the hole, the raised lip preventing liquid fuel from passing into the hole until a level of the liquid fuel exceeds the height of the raised lip.

68. The fuel collector of clause 67, wherein the raised lip is formed from a non-wetting material.

69. The fuel collector of clause 67, wherein the raised lip is formed from molybdenum.

70. The fuel collector of clause 67, wherein the raised lip has a rounded upper surface.

71. The fuel collector of clause 67, wherein the height of raised lip is equal to or greater than a capillary length of the liquid fuel.

72. The fuel collector of clause 67, further comprising a lip which projects downwardly from the hole.

73. The fuel collector of clause 72, wherein the downwardly projecting lip has sharp inner corner.

74. A radiation source configured to deliver fuel to a location from which the fuel emits EUV radiation, wherein the radiation source comprises:
a fuel debris receiving surface; and
a fuel collector, the fuel collector comprising a receptacle and a reservoir, the reservoir being located above the receptacle, and
wherein the reservoir is provided with a hole through which liquid fuel may drain from the reservoir into the receptacle, and
wherein a raised lip extends around the hole, the raised lip preventing liquid fuel from passing into the hole until a level of the liquid fuel exceeds the height of the raised lip.

75. A radiation source housing apparatus comprising:
a rotatably mounted housing;
an actuator arranged to drive the housing to rotate;
a heater located adjacent to a first portion of the housing; and
a cooler located adjacent to a second different portion of the housing.

76. The radiation source housing apparatus of clause 75, wherein the first portion of the housing does not have a downwardly facing inner surface.

77. The radiation source housing apparatus of clause 75, wherein the first portion of the housing does not have an inner surface from within which liquid fuel can drip.

78. The radiation source housing apparatus of clause 75, wherein the first portion of the housing is a lowermost side of the rotatably mounted housing.

79. The radiation source housing apparatus of clause 75, wherein the heater is arranged to heat the first portion of the rotatably mounted housing to a temperature which is above the melting temperature of tin, and wherein the cooler is arranged to cool the second portion of the rotatably mounted housing to a temperature which is below the melting temperature of tin.

80. The radiation source housing apparatus of clause 75, wherein the cooler extends around at least two thirds of the circumference of the rotatably mounted housing.

81. The radiation source housing apparatus of clause 75, wherein the heater extends around less than one third of the circumference of the rotatably mounted housing.

82. The radiation source housing apparatus of clause 75, wherein the heater and the cooler do not overlap around the circumference of the rotatably mounted housing.

83. The radiation source housing apparatus of clause 75, wherein the heater does not extend so far around the housing circumference that the tin will remain in liquid form after the housing has rotated to a point at which the tin is on a downwardly facing surface.

84. The radiation source housing apparatus of clause 75, wherein the inner surface of the housing is provided with grooves.

85. A radiation source comprising:
a fuel source configured to deliver fuel to a location from which the fuel emits EUV radiation; and
a radiation source housing apparatus comprising
a rotatably mounted housing,
an actuator arranged to drive the housing to rotate,
a heater located adjacent to a first portion of the housing, and
a cooler located adjacent to a second different portion of the housing.

86. The radiation source of clause 85, wherein the heater is arranged to heat the first portion of the rotatably mounted housing to a temperature which is above the melting temperature of the fuel, and wherein the cooler is arranged to cool the second portion of the rotatably mounted housing to a temperature which is below the melting temperature of the fuel.

87. The radiation source of clause 85, wherein the heater is arranged to heat the first portion of the rotatably mounted housing to a temperature at which fuel on the housing will be in a liquid state, and wherein the cooler is arranged to cool the second portion of the rotatably mounted housing to a temperature at which fuel on the housing will be in a solid state.

88. A method of generating EUV radiation comprising:
delivering fuel to a location from which the fuel emits EUV radiation;
driving a radiation source housing to rotate;
heating a portion of the housing to a temperature which is above the melting temperature of the fuel; and
cooling a portion of the housing to a temperature which is below the melting temperature of the fuel.

89. A fuel collector for an EUV radiation source, the fuel collector comprising:
a receptacle, said receptacle being provided with an entrance and a storage portion;
an object which is disposed within the receptacle such that fuel passing through the entrance is incident upon a surface of the object; and
a fuel transferring mechanism configured to transfer fuel collected upon the surface to the storage portion.

90. The fuel collector of clause 89, wherein the object is formed from a material which is low wetting with respect to a fuel it is desired to collect.

91. The fuel collector of clause 90, wherein the object is formed from molybdenum.

92. The fuel collector of any of clauses 89 to 90, wherein the object is operable to move between a first position and a second position.

93. The fuel collector of clause 92, wherein movement of the object between the first and second positions provides the fuel transferring mechanism.

94. The fuel collector of clause 92 wherein the object is arranged so that as fuel accumulates upon the surface, the object moves from the first position towards the second position.

95. The fuel collector of clause 92, wherein the object is resiliently biased towards the first position.

96. The fuel collector of any of clauses 89 to 91, wherein the object comprises a cantilever structure.

97. The fuel collector of any of clauses 89 to 91, wherein the object comprises a wheel and wherein rotation of the wheel provides the fuel transferring mechanism.

98. The fuel collector of any of clauses 89 to 91, wherein the object comprises a shelf, and wherein a member that is operable to sweep across the shelf provides the fuel transferring mechanism.

99. The fuel collector of any of clauses 89 to 91, wherein the fuel collector further comprises first and second valves arranged to form an air lock.

100. A fuel collector for an EUV radiation source, the fuel collector comprising: a receptacle, said receptacle being provided with a surface arranged such that fuel passing through an entrance of the receptacle is incident thereupon, wherein the surface is formed from a material which is low wetting with respect to a fuel it is desired to collect, the temperature of the surface is below the melting point of the fuel and the surface is inclined with respect to horizontal such that the surface forms a slide.

101. The fuel collector of clause 100, wherein the fuel collector comprises a first valve which is disposed towards an entrance end of the receptacle.

102. The fuel collector of clause 100 or clause 101, wherein the receptacle comprises an exit located in a lower portion thereof.

103. The fuel collector of clause 100 or clause 101, wherein fuel collector comprises a second valve which is located at an exit of the receptacle.

104. The fuel collector of clause 101, wherein the fuel collector comprises a second valve which is located at an exit of the receptacle, and wherein the first and second valves form an air lock.

The invention claimed is:

1. A radiation source comprising:
a fuel source configured to deliver fuel to a location from which the fuel emits EUV radiation; and
an immobile fuel debris receiving surface provided with a plurality of vanes and a plurality of grooves, the grooves being arranged to direct a flow of liquid fuel under the influence of gravity along a same plane towards a drain or gutter, wherein the plurality of grooves are provided in the vanes, and wherein the vanes are reflective structures located in the vicinity of an intermediate focus of the radiation source.

2. The radiation source of claim 1, wherein the immobile fuel debris receiving surface is provided with a plurality of vanes, and wherein the plurality of grooves are provided in the vanes.

3. The radiation source of claim 1, wherein at least some of the grooves have a cross-sectional size and/or shape that gives rise to capillary action.

4. The radiation source of claim 1, wherein at least some of the grooves have a cross-sectional size and/or shape that gives rise to wicking action which draws liquid fuel into the grooves.

5. The radiation source of claim 1, wherein the grooves comprise a set of grooves that extend substantially parallel to one another.

6. The radiation source of claim 1, wherein adjacent vanes are separated by a distance that is equal to or less than six millimeters.

7. The radiation source of claim 1, wherein the vanes are heated by a heating apparatus to a temperature that is above the melting temperature of the fuel and below the evaporation temperature of the fuel.

8. An apparatus comprising a radiation source having a fuel source configured to deliver fuel to a location from which the fuel emits EUV radiation, wherein the radiation source further comprises an immobile fuel debris receiving surface provided with a plurality of vanes and a plurality of grooves, the grooves being arranged to direct a flow of liquid fuel under the influence of gravity along a same plane towards a drain or gutter, wherein the plurality of grooves are provided in the vanes, and wherein the vanes are reflective structures located in the vicinity of an intermediate focus of the radiation source.

9. A method of generating EUV radiation using a radiation source, the method comprising:
delivering fuel to a location at which a plasma that emits EUV radiation is generated using the fuel; and
receiving liquid fuel on an immobile surface of the radiation source,
wherein grooves provided in a plurality of vanes on the immobile surface direct the flow of liquid fuel under the influence of gravity along a same plane towards a drain or gutter, wherein the vanes are reflective structures located in the vicinity of an intermediate focus of the radiation source.

10. A radiation source comprising:
a fuel source configured to deliver fuel to a location from which the fuel emits EUV radiation;
a fuel debris receiving surface; and
a conduit connected to a source of liquid fuel and configured to deliver the liquid fuel from the source via openings through a wall of the conduit directly onto the fuel debris receiving surface disposed outside of the conduit, such that a coating of liquid fuel is maintained and continuously flows across the fuel debris receiving surface.

11. The radiation source of claim 10, wherein the fuel debris receiving surface comprises a plurality of vanes.

12. A method of controlling contamination in a radiation source that uses fuel to generate EUV radiation, the method comprising:
delivering liquid fuel from a source connected to a conduit directly onto a fuel debris receiving surface via openings through a wall of the conduit, such that a coating of liquid fuel is maintained and continuously flows across the fuel debris receiving surface, wherein the fuel debris receiving surface is disposed outside of the conduit.

13. A method of generating EUV radiation using a radiation source, the method comprising:
delivering fuel to a location at which a plasma that emits EUV radiation is generated using the fuel;
receiving liquid fuel on an immobile surface of the radiation source, and
using grooves provided in a plurality of vanes on the immobile surface to direct a flow of the liquid fuel under the influence of gravity along a same plane towards a drain or gutter, wherein the vanes are reflective structures located in the vicinity of an intermediate focus of the radiation source.

14. A radiation source comprising:
a fuel source configured to deliver fuel to a location from which the fuel emits EUV radiation;
a fuel debris receiving surface; and
a conduit connected to a source of liquid alloy or metal and configured to deliver the liquid alloy or metal from the source via openings through a wall of the conduit directly onto the fuel debris receiving surface disposed outside of the conduit, such that a coating of the liquid alloy or metal is maintained and continuously flows across the fuel debris receiving surface at room temperature.

* * * * *